United States Patent
Orchowski

(10) Patent No.: US 11,688,583 B2
(45) Date of Patent: Jun. 27, 2023

(54) OPERATING A PARTICLE BEAM APPARATUS WITH AN OBJECT HOLDER

(71) Applicant: Carl Zeiss Microscopy GmbH, Jena (DE)

(72) Inventor: Alexander Orchowski, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 11 days.

(21) Appl. No.: 17/458,771

(22) Filed: Aug. 27, 2021

(65) Prior Publication Data

US 2022/0230843 A1 Jul. 21, 2022

(30) Foreign Application Priority Data

Aug. 28, 2020 (DE) .......................... 102020122535.0

(51) Int. Cl.
*H01J 37/28* (2006.01)
*H01J 37/20* (2006.01)
*H01J 37/304* (2006.01)

(52) U.S. Cl.
CPC ............. *H01J 37/28* (2013.01); *H01J 37/20* (2013.01); *H01J 37/3045* (2013.01); *H01J 2237/20221* (2013.01); *H01J 2237/2802* (2013.01); *H01J 2237/30494* (2013.01)

(58) Field of Classification Search
CPC ........ H01J 37/28; H01J 37/20; H01J 37/3045; H01J 2237/20221; H01J 2237/2802; H01J 2237/30494; H01J 2237/31745; H01J 2237/31749; H01J 37/261; H01J 37/30; G01N 1/286; G01N 2001/2866; G01N 2223/07; G01N 23/20091; G01N 23/2209; G01N 23/2251; B23K 37/04
See application file for complete search history.

(56) References Cited

U.S. PATENT DOCUMENTS 6,538,254 B1 * 3/2003 Tomimatsu .............. G01N 1/32
250/442.11
8,314,410 B2 * 11/2012 Straw ..................... H01J 37/244
250/397

(Continued)

FOREIGN PATENT DOCUMENTS

WO WO 02/067286 A2 8/2002

*Primary Examiner* — David A Vanore
(74) *Attorney, Agent, or Firm* — Muirhead and Saturnelli, LLC

(57) ABSTRACT

The system described herein relates to a method for operating a beam apparatus, such as a particle beam apparatus or laser beam apparatus, a computer program product and a beam apparatus for carrying out the method, and to an object holder for an object that, for example, is able to be arranged in a particle beam apparatus. The method includes generating a marking on an object holder using a laser beam of a laser beam device and/or using a particle beam of the particle beam apparatus, where the particle beam includes charged particles, arranging an object on the object holder, moving the object holder, positioning the particle beam and/or the laser beam in relative fashion in relation to the object using the marking, and processing, imaging and/or analyzing the object using the particle beam and/or the laser beam.

24 Claims, 9 Drawing Sheets

(56) References Cited

U.S. PATENT DOCUMENTS

| | | | |
|---|---|---|---|
| 8,536,525 B2* | 9/2013 | Blackwood | G01N 1/32 250/311 |
| 8,704,196 B2* | 4/2014 | Wolleschensky | G02B 21/0076 250/458.1 |
| 2004/0036031 A1* | 2/2004 | Rose | H01J 37/153 250/396 R |
| 2006/0139049 A1* | 6/2006 | Zhang | G01R 31/2898 324/754.22 |
| 2013/0213945 A1* | 8/2013 | Stegmann | G01N 23/04 219/121.83 |
| 2014/0143912 A1* | 5/2014 | Ukraintsev | G01Q 60/48 850/1 |
| 2015/0009489 A1* | 1/2015 | Mulders | G01N 21/65 356/72 |
| 2015/0036122 A1* | 2/2015 | Edelmann | G01N 21/17 356/72 |
| 2015/0153560 A1* | 6/2015 | Lippert | G02B 21/367 348/79 |
| 2016/0035534 A1* | 2/2016 | Biberger | H01J 37/265 250/307 |
| 2016/0118216 A1* | 4/2016 | Doemer | H01J 37/28 250/307 |
| 2016/0139398 A1* | 5/2016 | Negishi | H01J 37/20 359/393 |
| 2016/0274040 A1* | 9/2016 | Pérez-Willard | G01N 23/2255 |
| 2017/0296997 A1* | 10/2017 | Mukherjee | H01M 4/921 |
| 2018/0166247 A1* | 6/2018 | Moore | H01J 37/02 |
| 2019/0341223 A1* | 11/2019 | Berger | G02B 21/34 |
| 2021/0241992 A1* | 8/2021 | Schertel | H01J 37/145 |
| 2022/0230843 A1* | 7/2022 | Orchowski | H01J 37/28 |
| 2022/0236551 A1* | 7/2022 | Amthor | G02B 21/361 |

* cited by examiner

OPERATING A PARTICLE BEAM APPARATUS WITH AN OBJECT HOLDER

CROSS-REFERENCE TO RELATED APPLICATIONS

This application claims the priority of the German patent application No. 10 2020 122 535.0, filed on Aug. 28, 2020, which is incorporated herein by reference.

TECHNICAL FIELD

The system described herein relates to a method for operating a beam apparatus, in particular a particle beam apparatus and/or laser beam apparatus. The system described herein further relates to a computer program product and a beam apparatus for carrying out the method. Moreover, the system described herein relates to an object holder for an object. By way of example, the object holder is able to be arranged in a particle beam apparatus.

BACKGROUND

Electron beam apparatuses, in particular a scanning electron microscope (also referred to as SEM below) and/or a transmission electron microscope (also referred to as TEM below), are used to examine objects (samples) in order to obtain knowledge with respect to the properties and the behavior under certain conditions.

In an SEM, an electron beam (also referred to as primary electron beam below) is generated by a beam generator and focused onto an object to be examined by way of a beam guiding system. The primary electron beam is guided in a raster manner over a surface of the object to be examined by way of a deflection device. Here, the electrons of the primary electron beam interact with the object to be examined. As a consequence of the interaction, in particular, electrons are emitted by the object (so-called secondary electrons) and electrons of the primary electron beam are backscattered (so-called backscattered electrons). The secondary electrons and backscattered electrons are detected and used for image generation. An image representation of the object to be examined is thus obtained. Further, interaction radiation, for example x-ray radiation and cathodoluminescence, is generated as a consequence of the interaction. The interaction radiation may be used to analyze the object.

In the case of a TEM, a primary electron beam is likewise generated by a beam generator and focused onto an object to be examined by a beam guiding system. The primary electron beam passes through the object to be examined. When the primary electron beam passes through the object to be examined, the electrons of the primary electron beam interact with the material of the object to be examined. The electrons passing through the object to be examined are imaged onto a luminescent screen or onto a detector (for example a camera) by a system consisting of an objective and a projection unit. Here, imaging may also take place in the scanning mode of a TEM. As a rule, such a TEM is referred to as a STEM. Additionally, provision can be made for detecting electrons backscattered at the object to be examined and/or secondary electrons emitted by the object to be examined by a further detector in order to image an object to be examined.

Furthermore, it is known from the prior art to use combination apparatuses for examining objects, where both electrons and ions can be guided onto an object to be examined. By way of example, it is known to additionally equip an SEM with an ion beam column. An ion beam generator arranged in the ion beam column generates ions that are used for preparing an object (for example ablating material of the object or applying material to the object) or else for imaging. The SEM serves here in particular for observing the preparation, but also for further examination of the prepared or unprepared object.

In a further known particle beam apparatus, applying material to the object is carried out for example using the feed of a gas. The known particle beam apparatus is a combination apparatus that provides both an electron beam and an ion beam. The particle beam apparatus includes an electron beam column and an ion beam column. The electron beam column provides an electron beam that is focused onto an object. The object is arranged in a sample chamber kept under vacuum. The ion beam column provides an ion beam that is likewise focused onto the object. By way of example, a layer of the surface of the object is removed by the ion beam. After the layer has been removed, a further surface of the object is exposed. Using a gas feed device, a gaseous precursor substance—a so-called precursor—can be admitted into the sample chamber. It is known to embody the gas feed device with an acicular device, which can be arranged very close to a position of the object at a distance of a few μm, such that the gaseous precursor substance can be guided to the position as accurately as possible and with a high concentration. As a result of the interaction of the ion beam with the gaseous precursor substance, a layer of a substance is deposited on the surface of the object. By way of example, it is known for gaseous phenanthrene to be admitted as gaseous precursor substance into the sample chamber using the gas feed device. Essentially a layer of carbon or a carbon-containing layer then deposits on the surface of the object. It is also known to use a gaseous precursor substance that includes metal in order to deposit a metal or a metal-containing layer on the surface of the object. However, the depositions are not limited to carbon and/or metals. Rather, arbitrary substances can be deposited on the surface of the object, for example semiconductors, non-conductors or other compounds. Furthermore, it is known for the gaseous precursor substance to be used for ablating material of the object upon interaction with a particle beam.

The application of material on the object and/or ablation of material from the object is used for arranging a marking on the object, for example. In the prior art, the marking is used, for example, for positioning the electron beam and/or the ion beam.

To carry out a high-resolution analysis of material structures in an object in a TEM or in an SEM with a transmission detector, it is known to prepare the object in such a way that the thickness of the object is less than 100 nm since the electrons of an electron beam have a range of typically 1000 nm in solid material in the case of a transmission of the electrons through the object. Upon entry into the object, the electrons typically have an energy of a few 10 keV to several 100 keV. The thickness of the object of less than 100 nm ensures that a predominant part of the electrons passes through the object and is able to be detected using a detector.

The prior art has disclosed a practice of processing the object using an ion beam in order to attain a thickness of the object of less than 100 nm, for example a thickness ranging from 1 nm to 80 nm or from 1 nm to 50 nm. The processing of the object using the ion beam can be observed by imaging the object using an electron beam.

A method, which is known from the prior art, for generating an object intended for examination with a TEM or with an SEM using a transmission detector is described below. Initially, a portion of a material piece with extents in the millimeter range, for example, is exposed using an ion beam and extracted from the material piece. By way of example, the portion has a thickness of a few micrometers (in particular 3 µm to 6 µm), for example, and a length of a few 10 µm (in particular 30 µm to 80 µm), for example. Subsequently, the portion is fastened to a micromanipulator and lifted out of the material piece. Thereupon, the portion is fastened to a TEM object holder (also referred to as a "TEM grid"). Using an ion beam guided to the portion, material of the portion is ablated until the portion or at least a region of the portion has a thickness of less than 100 nm. When ablating material from the portion, the TEM object holder is rotated about an axis of rotation, initially through 1° to 2° in a first direction from an initial position, in order to ensure good ablation of material on a first side of the portion. Then, the TEM object holder is rotated about the axis of rotation, through 1° to 2° in a second direction from the initial position, in order to ensure good ablation of material on a second side of the portion. The first side and the second side of the portion are arranged opposite to and spaced apart from one another. So that the TEM object holder is rotatable, the TEM object holder is arranged on a sample stage embodied to be movable. The sample stage includes mechanical movement units which facilitate a rotation of the TEM object holder.

In respect of the prior art, reference is made to U.S. Pat. No. 8,536,525 B2.

SUMMARY OF THE INVENTION

On account of imprecision in the mechanism of the movement units of the sample stage, there can be an unwanted relative displacement of the position of the ion beam in relation to the portion in the case of a rotation of the TEM object holder about the axis of rotation. Expressed differently, following the rotation of the TEM object holder, the ion beam no longer strikes the portion arranged on the TEM object holder at the site on which the ion beam was focused prior to the rotation of the TEM object holder. In this case, the ion beam is readjusted and positioned in such a way in the prior art that the ion beam strikes the desired site on the portion in order to be able to ablate material.

The system described herein provides a method for operating a beam apparatus, a computer program product, a beam apparatus and an object holder, in which, following a movement of an object holder, a positioning of a particle beam of a particle beam apparatus or of a laser beam relative to an object arranged on the object holder is easily possible and, in particular, able to be carried out automatically.

According to the system described herein, a particle beam apparatus is operated to provide processing, imaging and/or analyzing of an object and/or a laser beam apparatus is operated to provide processing, imaging and/or analyzing of an object. By way of example, the particle beam apparatus may include at least one beam generator for generating a particle beam that includes charged particles. The charged particles are electrons or ions, for example.

In the method according to the system described herein, at least one marking is arranged on an object holder. Expressed differently, the marking is generated on the object holder. Arranging the marking on an object holder is implemented using a laser beam of a laser beam device and/or using at least one particle beam of a particle beam apparatus, where the particle beam includes charged particles. By way of example, provision is made for the laser beam device to be arranged on the particle beam apparatus. In addition or as an alternative thereto, provision is made for the laser beam device to be a device that is separate from the particle beam apparatus. By way of example, provision is made for material to be ablated from and/or applied to the object holder using the laser beam device so that the marking is generated by the material ablation. In addition or as an alternative thereto, provision is made for material to be ablated from the object holder and/or for material to be applied to the object holder in such a way using the particle beam that the marking is generated by the ablation of material and/or the application of material. By way of example, a gas is fed to the object holder for the purposes of applying material and/or ablating material. The gas interacts with the particle beam and/or the laser beam in such a way that the material is applied to the object holder or material is ablated from the object holder.

The method according to the system described herein also includes an arrangement of at least one object on the object holder. By way of example, for the purposes of arranging the object on the object holder, material is applied to a connecting site between the object and the object holder such that the object is connected to the object holder. To this end, a gas and the particle beam are fed to the object in such a way in one embodiment that, on account of the interaction of the particle beam with the gas, material is applied to the connecting site. In addition or as an alternative thereto, a gas and the laser beam are fed to the object in such a way in a further embodiment that, on account of the interaction of the laser beam with the gas, material is applied to the connecting site. However, the invention is not restricted to the aforementioned embodiments of arranging the object on the object holder. Rather, any type of arrangement of the object on the object holder that is suitable is able to be used.

Further, the object holder, and hence also the object arranged on the object holder, is moved in the system described herein. By way of example, moving the object holder includes a translational movement of the object holder along at least one axis. By way of example, the object holder is moved along a first axis, along a second axis and/or along a third axis, where the first axis, the second axis and the third axis are aligned perpendicular to one another in each case, for example. In addition or as an alternative thereto, provision is made for the object holder to be rotated about at least one axis of rotation. In particular, the aforementioned rotation includes a tilt of the object holder about an axis of rotation. In particular, provision is made for the object holder—and hence also the object arranged on the object holder—to be rotated about an axis of rotation, through 0.5° to 5°, in particular through 1° to 3° or through 1° to 2°, in a first direction and/or a second direction proceeding from an initial position. The aforementioned range boundaries of the angular ranges are included in the angular ranges. Explicit reference is made to the fact that the invention is not restricted to the aforementioned angular ranges. Rather, any angular range that is suitable can be used. In one embodiment, provision is additionally or alternatively made for the object holder to be rotated about a first axis of rotation and/or about a second axis of rotation. By way of example, the first axis of rotation and the second axis of rotation are aligned perpendicular to one another.

The method according to the system described herein also includes positioning the particle beam and/or the laser beam in relative fashion in relation to the object using the marking. Expressed differently, the particle beam and/or the laser beam are/is readjusted and positioned relative to the object following the movement of the object holder, in such a way that the particle beam is able to be guided to any desired site on the object. Relative positioning of the particle beam and/or of the laser beam in relation to the object is implemented, for example, by (a) readjusting (i.e., positioning) the particle beam (for example using deflection units of the particle beam apparatus) and/or by (b) readjusting (i.e., positioning) the laser beam (for example using guiding units for the laser beam) and/or by (c) readjusting (i.e., positioning) the object holder by moving the object holder. The method according to the system described herein then also includes processing, imaging and/or analyzing the object using the positioned particle beam and/or the positioned laser beam.

The method according to the invention is not restricted to the aforementioned sequence of the explained method steps. Rather, any sequence of the aforementioned method steps that is suitable can be chosen.

The system described herein is also advantageous in that, in particular following a movement of the object holder but also after any other relative movement of the object holder in relation to the particle beam and/or the laser beam, relative positioning of the particle beam of the particle beam apparatus and/or of the laser beam of the laser beam device is easily facilitated in relation to the object arranged on the object holder. In particular, the relative positioning of the particle beam and/or of the laser beam in relation to the object can be carried out automatically.

In one embodiment, the object holder is embodied as an object holder suitable for feeding an examination particle beam to the object, where the examination particle beam includes particles which transmit through the object. By way of example, the object holder is embodied as a TEM object holder which is able to be used in a TEM and/or in an SEM with a transmission detector and/or in a combination apparatus with an ion beam column, an electron beam column and a transmission detector. Explicit reference is made to the fact that the particle beam apparatus used to carry out the method according to the system described herein need not necessarily be the particle beam apparatus which provides the examination particle beam. Rather, the object holder can be unloaded from the particle beam apparatus used to carry out the method according to the system described herein and loaded into a further particle beam apparatus, in which the object is subsequently examined using the examination particle beam. By way of example, the further particle beam apparatus is a TEM.

In a further embodiment of the method according to the system described herein, the object is generated by the particle beam of the particle beam apparatus and/or the laser beam of the laser beam device before the object is arranged on the object holder. By way of example, in one embodiment, the object in the form of a portion of a material piece is exposed in the material piece using the particle beam, for example an ion beam, and extracted from the material piece. By way of example, the material piece has extents in the millimeter range. By contrast, the extracted object in the form of the portion has a thickness of a few micrometers (in particular 3 µm to 6 µm), for example, and a length of a few 10 µm (in particular 30 µm to 80 µm), for example. Subsequently, the object in the form of the portion is for example fastened to a micromanipulator and lifted out of the material piece. Subsequently, the object in the form of the portion is arranged on the object holder. In addition or as an alternative thereto, provision is made for the object to be arranged directly on the object holder without implementing the intermediate step, specifically arranging the object on the micromanipulator.

In yet a further embodiment of the method according to the system described herein, provision is additionally or alternatively made for the object to be arranged on the object holder in such a way that a face of the object is arranged at an angle of 0° to 360° with respect to a face of the object holder that is freely accessible to the particle beam and/or the laser beam. Here, the marking is arranged on the aforementioned face of the object holder. In one embodiment of the method according to the system described herein, the face of the object is arranged parallel to the face of the object holder that is freely accessible to the particle beam and/or the laser beam. As an alternative thereto, provision is made for the face of the object to be arranged at an angle of 5° to 80°, for example with respect to the face of the object holder that is freely accessible to the particle beam and/or the laser beam. By way of example, provision is made for the face of the object and the face of the object holder to be arranged in different planes. As an alternative thereto, provision is made for the face of the object and the face of the object holder to be arranged in a single plane. Expressed differently, the face of the object and the face of the object holder are level. This embodiment of the method ensures particularly good relative positioning of the particle beam and/or of the laser beam in relation to the object since the marking and the object are arranged in a single plane.

In yet a further embodiment of the method according to the system described herein, provision is additionally or alternatively made for the face of the object holder to be generated using the particle beam and/or the laser beam before the marking is arranged on the face of the object holder. If the object holder does not have a face that is suitable for arranging the marking or only has a face with little suitability for arranging the marking, then provision is made in this embodiment for the face of the object holder to be initially generated on the object holder, for example. Then, the face of the object holder is generated using the particle beam, for example an ion beam, and/or the laser beam on the object holder by, for example, ablating material of the object holder using the particle beam and/or the laser beam. For ablation purposes, a gas can be fed to the object holder in particular. Material ablation on the object holder is brought about as a result of an interaction of the ion beam and/or the laser beam with the gas and with the object holder. In addition or as an alternative thereto, provision is made for the face of the object holder to be generated, for example, by applying material to the object holder using the particle beam and/or the laser beam while feeding a gas. By way of example, application of material to the object holder is brought about as a result of an interaction of the ion beam and/or the laser beam with the gas.

In one embodiment of the method according to the system described herein, provision is additionally or alternatively made for a reference image that includes the marking to be generated by imaging the marking using the particle beam. In this case, both above and below, a reference image that includes the marking is understood to be a reference image which has an image representation of the marking. Moreover, a further image that includes the marking is generated. In this case, both above and below, an image that includes the marking is understood to be an image which has an image representation of the marking. Expressed differently, a further image that includes the marking is generated by imaging the marking again using the particle beam. By way of example, an ion beam and/or an electron beam are/is used as a particle beam when generating a reference image that includes the marking and the further image that includes the marking. Subsequently, there is a comparison of the reference image that includes the marking with the further image that includes the marking. Subsequently, a displacement vector is determined using the comparison of the reference image that includes the marking with the further image that includes the marking. The relative positioning of the particle beam and/or the laser beam is then implemented using the determined displacement vector. By way of example, the mathematical method of cross correlation, already known from the prior art, is used when determining the displacement vector.

In a further embodiment of the method according to the system described herein, provision is additionally or alternatively made for the particle beam to have a specifiable beam current, where both generating the further image that includes the marking and processing, imaging and/or analyzing the object being implemented using the particle beam with a specifiable beam current. As an alternative thereto, provision is made for the particle beam to have a specifiable beam current, where (i) generating the reference image that includes the marking, (ii) generating the further image that includes the marking and (iii) processing, imaging and/or analyzing the object are implemented using the particle beam with the specifiable beam current. Therefore, in the aforementioned embodiments, provision is made for the particle beam to always be operated with the same beam current (specifically, the specifiable beam current), to be precise when generating the reference image that includes the marking, when generating the further image that includes the marking, when processing the object, when imaging the object and/or when analyzing the object.

In a further embodiment of the method according to the system described herein, provision is additionally or alternatively made for the particle beam to have a specifiable first beam current or a specifiable second beam current. The first beam current differs from the second beam current. The generation of the further image that includes the marking using the particle beam is implemented with the first specifiable beam current. By contrast, processing, imaging and/or analyzing the object is/are implemented using the particle beam with the second specifiable beam current. As an alternative thereto, provision is made for the particle beam to have a specifiable first beam current or a specifiable second beam current. Here, too, the first beam current differs from the second beam current. The generation of the reference image that has the first marking and/or the generation of the further image that includes the marking is/are implemented using the particle beam with the specifiable first beam current. Moreover, processing, imaging and/or analyzing the object is/are implemented using the particle beam with the second specifiable beam current. In the aforementioned embodiments, provision is therefore made for the particle beam to be operated with different beam currents.

In yet a further embodiment of the method according to the system described herein, provision is additionally or alternatively made for the processing of the object to include an ablation of material from the object. By way of example, material is ablated from the object using an ion beam and/or the laser beam. To this end, at least one gas in particular is fed to the object, where the gas interacts with the particle beam and/or the laser beam and with the object in such a way that material is ablated from the object. In addition or as an alternative thereto, provision is made for the processing of the object to include an arrangement of material on the object using, for example, at least one gas being fed to the object, where the gas interacts with the particle beam and/or the laser beam in such a way that material is arranged on the object. By way of example, an ion beam is used as the particle beam. By way of example, a gaseous precursor substance—a so-called precursor—can be admitted into the sample chamber by a gas feed device. In particular, the gas feed device has an acicular device, which can be arranged very close to a position of the object at a distance of a few µm, such that the gaseous precursor substance can be guided to the position as accurately as possible and with a high concentration. As a result of the interaction of the ion beam with the gaseous precursor substance, a layer of a substance is deposited on the surface of the object. By way of example, gaseous phenanthrene is admitted as gaseous precursor substance into the sample chamber by the gas feed device. Essentially a layer of carbon or a carbon-containing layer then deposits on the surface of the object. Moreover, a gaseous precursor substance including metal can also be used to deposit a metal or a metal-containing layer on the surface of the object. However, the depositions are not limited to carbon and/or metals. Rather, arbitrary substances can be deposited on the surface of the object, for example semiconductors, non-conductors or other compounds.

Further additionally or in a further alternative thereto, provision is made for the analysis of the object to include at least one of the following analysis types:
- an analysis using EDX (EDX being the abbreviation for energy dispersive x-ray spectroscopy),
- an analysis using WDX (WDX being the abbreviation for wavelength dispersive x-ray spectroscopy),
- an analysis using EBSD (EBSD being the abbreviation for electron backscatter diffraction),
- an analysis using TKD examinations (TKD being the abbreviation for transmission Kikuchi diffraction),
- an analysis using an electron beam imaging, and
- an analysis using a transmission detector, for example in STEM detector in an SEM or in a combination apparatus with an electron beam column and with an ion beam column.

In one embodiment of the method according to the system described herein, provision is additionally or alternatively made for the charged particles to be ions. By way of example, the ions are gallium ions. However, the invention is not restricted to the aforementioned ions. Rather, any type of ion which is suitable can be used. As an alternative thereto, provision is made for the charged particles to be electrons.

In one embodiment of the method according to the system described herein, provision is additionally or alternatively made for the method to have one of the following features:
(i) The particle beam is a first particle beam. The object is imaged using a second particle beam;
(ii) The particle beam is a first particle beam, the charged particles of the first particle beam including ions. The object is imaged using a second particle beam, the second particle beam including electrons.

In a further embodiment of the method according to the system described herein, provision is additionally or alternatively made for a reference image that includes the marking to be generated by imaging the marking using the second particle beam. The reference image that includes the marking is referred to below as a further reference image that includes the marking. Additionally, a further image that includes the marking is generated by imaging the marking again using the second particle beam. The further image that includes the marking is referred to below as yet further image that includes the marking.

This is followed by a comparison of the further reference image that includes the marking with the yet further image that includes the marking, and a determination of a displacement vector using the comparison of the further reference image that includes the marking with the yet further image that includes the marking. Below, the displacement vector is referred to as a further displacement vector. The relative positioning of the particle beam and/or the laser beam is implemented using the further displacement vector. By way of example, the mathematical method of cross correlation, already known from the prior art, is used when determining the further displacement vector.

In yet a further embodiment of the method according to the system described herein, provision is additionally or alternatively made for the method to have at least one of the following features:

(i) the marking is generated as a marking with at least one edge. From the edge, a first plane extends in a first dimension and a second plane extends in a second dimension;

(ii) the marking is generated as a marking with at least one first edge and with at least one second edge. The first edge and the second edge can be aligned in different directions. Both from the first edge and from the second edge, a first plane extends in a first dimension in each case and a second plane extends in a second dimension in each case. Here, the first planes, for example, are different from one another in each case. In particular, provision is also made for the second planes to be different from one another in each case;

(iii) the marking is generated as a cross-shaped marking and/or as a polygon;

(iv) the marking is generated as a star-shaped marking;

(v) the marking is generated as an X-shaped marking;

(vi) the marking is generated as an L-shaped marking;

(vii) the marking is generated by ablating material and/or by applying material.

The system described herein also relates to a computer program product including program code which is loadable or loaded into a processor of a beam apparatus, in particular of a particle beam apparatus and/or a laser beam apparatus, where the program code, when executed in the processor, controls the beam apparatus in such a way that a method having at least one of the aforementioned or following features or having a combination of at least two of the aforementioned or following features is carried out.

The system described herein further relates to a beam apparatus for processing, imaging and/or analyzing an object. The beam apparatus according to the system described herein includes at least one beam generator for generating a particle beam that includes charged particles and/or a laser beam. The charged particles are electrons or ions, for example. Moreover, the beam apparatus includes an object holder for arranging the object. Further, the beam apparatus includes a scanning device for scanning the particle beam and/or the laser beam over the object. The beam apparatus also includes at least one detector for detecting interaction particles and/or interaction radiation which emerge/emerges from an interaction between the particle beam and/or the laser beam and the object when the particle beam and/or the laser beam is incident on the object. Furthermore, the beam apparatus according to the system described herein is provided with at least one display device for displaying the image and/or the analysis of the object. The beam apparatus according to the system described herein is also provided with at least one control unit with a processor in which a computer program product having at least one of the aforementioned or following features or having a combination of at least two of the aforementioned or following features is loaded.

In an embodiment of the beam apparatus according to the system described herein, provision is additionally or alternatively made for the beam apparatus to be embodied as a particle beam apparatus. It further includes at least one objective lens for focusing the particle beam onto the object.

In a further embodiment of the beam apparatus according to the system described herein in the form of the particle beam apparatus, provision is additionally or alternatively made for the beam generator to be embodied as a first beam generator and for the particle beam to be embodied as a first particle beam with first charged particles. Further, the objective lens is embodied as a first objective lens for focusing the first particle beam onto the object. Moreover, the beam apparatus according to the system described herein includes at least one second beam generator for generating a second particle beam including second charged particles. Further, the beam apparatus according to the system described herein includes at least one second objective lens for focusing the second particle beam onto the object.

In particular, provision is made for the beam apparatus to be embodied as electron beam apparatus and/or as ion beam apparatus.

The system described herein also relates to an object holder for arrangement in a particle beam apparatus. By way of example, this particle beam apparatus is an electron beam apparatus and/or an ion beam apparatus. The object holder according to the system described herein includes at least one holding device for holding an object. Further, the object holder according to the system described herein has at least one marking for positioning a particle beam of the particle beam apparatus. By way of example, the marking is able to be generated on the object holder using a laser beam device and/or the particle beam of the particle beam apparatus. The object holder is embodied to feed charged particles which transmit through the object. By way of example, the charged particles are electrons or ions. By way of example, the object holder according to the system described herein is able to be used when carrying out the method according to the system described herein as described further above or as yet to be described further below.

In one embodiment of the object holder according to the system described herein, provision is additionally or alternatively made for the object holder to have a face, which is configured in such a way that the face is freely accessible to a particle beam of a particle beam apparatus and/or to a laser beam of a laser beam apparatus. Further, the marking is arranged on the face of the object holder. Moreover, the object holder is configured in such a way that a face of the object is able to be arranged at an angle of 0° to 360° with respect to the face of the object holder. In particular, provision is made for the face of the object to be able to be arranged parallel to the face of the object holder. By way of example, provision is made for the face of the object and the face of the object holder to be able to be arranged in different planes. As an alternative thereto, provision is made for the face of the object and the face of the object holder to be able to be arranged in a single plane. Expressed differently, the face of the object and the face of the object holder are level, which may provide particularly good relative positioning of the particle beam and/or of the laser beam in relation to the object since the marking and the object are arranged in a single plane.

In a further embodiment of the object holder according to the system described herein, provision is additionally or alternatively made for the marking to be arranged on the holding device. By way of example, the aforementioned holding device is a first holding device of numerous further holding devices arranged on the object holder. In particular, the further holding devices include a second holding device. In a further embodiment of the object holder according to the system described herein, the marking is arranged on the second holding device. By contrast, the first object is able to be arranged on the first holding device. The second holding device is arranged on the object holder in a manner separated from the first holding device. Consequently, the first holding device and the second holding device are not identical.

In yet a further embodiment of the object holder according to the system described herein, provision is additionally or alternatively made for the object holder to have at least one of the following features:
(i) the marking is formed as a marking with at least one edge. From the edge, a first plane extends in a first dimension and a second plane extends in a second dimension;
(ii) the marking is formed as a marking with at least one first edge and with at least one second edge. The first edge and the second edge can be aligned in different directions. From the first edge and from the second edge, a first plane extends in a first dimension and a second plane extends in a second dimension in each case. Here, the first planes, for example, are different from one another in each case. In particular, provision is also made for the second planes to be different from one another in each case;
(iii) the marking is formed as a cross-shaped marking and/or as a polygon;
(iv) the marking is formed as a star-shaped marking;
(v) the marking is formed as an X-shaped marking;
(vi) the marking is formed as an L-shaped marking;
(vii) the marking is a marking generated by ablating material and/or by applying material.

On account of the above-described embodiment, the aforementioned markings are particularly well-suited to an automatic identification and automatic relative positioning of the particle beam and/or laser beam in relation to the object.

BRIEF DESCRIPTION OF DRAWINGS

Further suitable or practical embodiments and advantages of the system described herein are set forth below in association with the drawings. In the figures.

DETAILED DESCRIPTION OF VARIOUS EMBODIMENTS

The system described herein is now explained in more detail using particle beam apparatuses in the form of an SEM and in the form of a combination apparatus, which includes an electron beam column and an ion beam column. Reference is explicitly made to the fact that the system described herein may be used in any particle beam apparatus, in particular in any electron beam apparatus and/or any ion beam apparatus.

Figure 1:
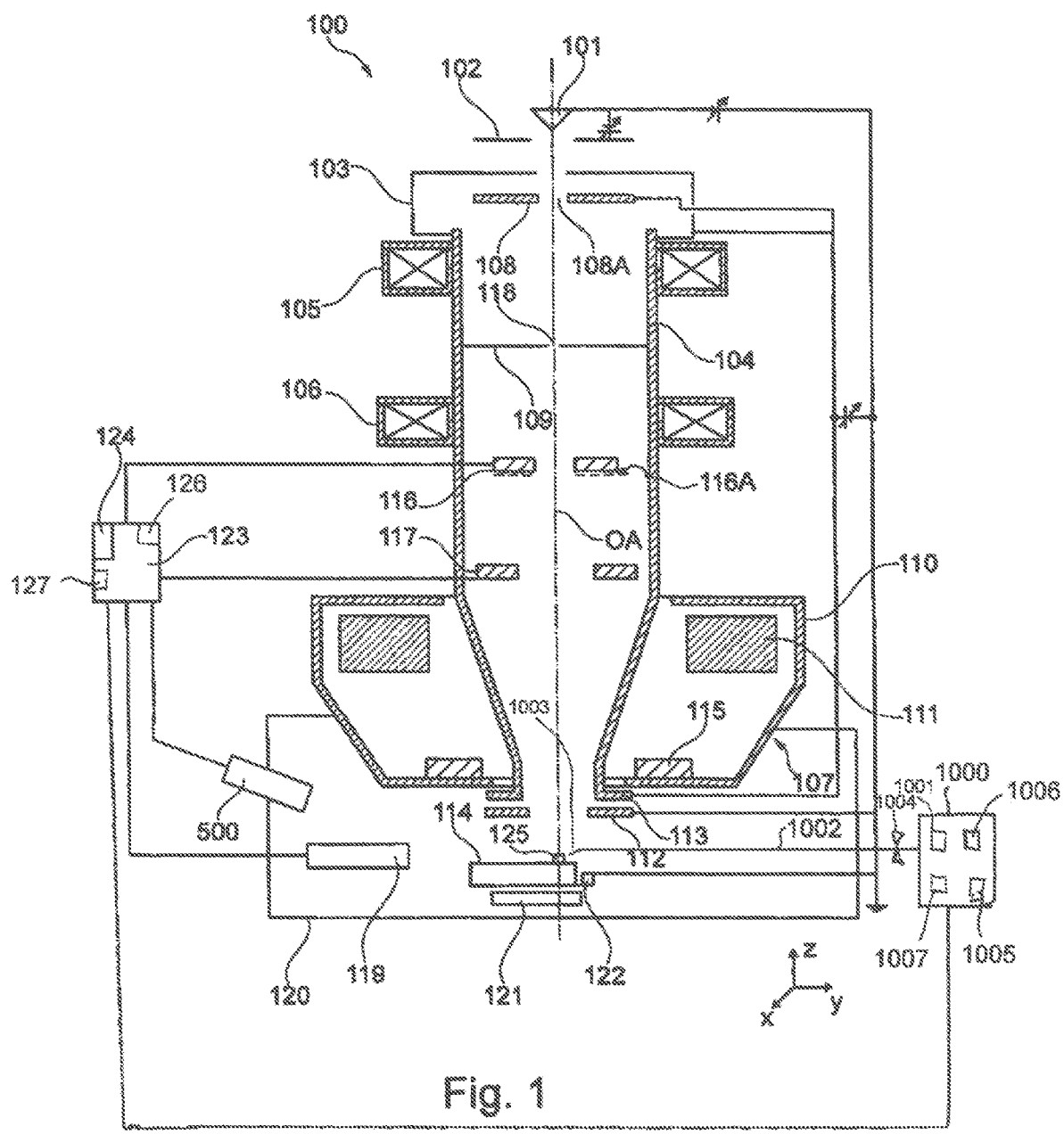
FIG. 1 shows a first embodiment of a particle beam apparatus according to the system described herein.

FIG. 1 shows a schematic illustration of an SEM 100. The SEM 100 includes a first beam generator in the form of an electron source 101, which is embodied as a cathode. Further, the SEM 100 is provided with an extraction electrode 102 and with an anode 103, which is placed onto one end of a beam guiding tube 104 of the SEM 100. By way of example, the electron source 101 is embodied as a thermal field emitter. However, the system described herein is not restricted to such an electron source 101. Rather, any electron source is utilizable.

Electrons emerging from the electron source 101 form a primary electron beam. The electrons are accelerated to the anode potential on account of a potential difference between the electron source 101 and the anode 103. In the embodiment illustrated in FIG. 1, the anode potential is 100 V to 35 kV, e.g., 5 kV to 15 kV, in particular 8 kV, relative to a ground potential of a housing of a sample chamber 120. However, alternatively, the anode potential could also be at ground potential.

Two condenser lenses, specifically a first condenser lens 105 and a second condenser lens 106, are arranged on the beam guiding tube 104. Here, proceeding from the electron source 101 as viewed in the direction of a first objective lens 107, the first condenser lens 105 is arranged first, followed by the second condenser lens 106. Reference is explicitly made to the fact that further embodiments of the SEM 100 may include only a single condenser lens. A first aperture unit 108 is arranged between the anode 103 and the first condenser lens 105. Together with the anode 103 and the beam guiding tube 104, the first aperture unit 108 is at a high voltage potential, specifically the potential of the anode 103, or connected to ground. The first aperture unit 108 has numerous first aperture unit openings 108A, of which one is illustrated in FIG. 1. By way of example, two first aperture unit openings 108A are present. Each one of the numerous first aperture unit openings 108A has a different opening diameter. Using an adjustment mechanism (not illustrated), it is possible to set a desired first aperture unit opening 108A onto an optical axis OA of the SEM 100. Reference is explicitly made to the fact that, in further embodiments, the first aperture unit 108 may be provided with only a single aperture unit opening 108A. In the embodiment shown in FIG. 1, an adjustment mechanism may be absent. The first aperture unit 108 is then designed to be stationary. A stationary second aperture unit 109 is arranged between the first condenser lens 105 and the second condenser lens 106. As an alternative thereto, provision is made for the second aperture unit 109 to be embodied in a movable fashion.

The first objective lens 107 includes pole pieces 110, in which a hole is formed. The beam guiding tube 104 is guided through this hole. A coil 111 is arranged in the pole pieces 110.

An electrostatic retardation device is arranged in a lower region of the beam guiding tube 104 and includes an individual electrode 112 and a tube electrode 113. The tube electrode 113 is arranged at one end of the beam guiding tube 104, the end facing an object 125 that is arranged at an object holder 114 embodied in a movable fashion.

Together with the beam guiding tube 104, the tube electrode 113 is at the potential of the anode 103, while the individual electrode 112 and the object 125 are at a lower potential in relation to the potential of the anode 103. In the embodiment of FIG. 1, the individual electrode 112 and the object 125 are at the ground potential of the housing of the sample chamber 120. In this manner, the electrons of the primary electron beam may be decelerated to a desired energy which is required for examining the object 125.

The SEM 100 further includes a scanning device 115 that deflects the primary electron beam and scans the primary electron beam over the object 125. Here, the electrons of the primary electron beam interact with the object 125. As a consequence of the interaction, interaction particles and/or interaction radiation arise/arises, which are/is detected. In particular, electrons are emitted from the surface of the object 125 or from regions of the object 125 close to the surface—so-called secondary electrons—or electrons of the primary electron beam are backscattered—so-called backscattered electrons—as interaction particles.

The object 125 and the individual electrode 112 may also be at different potentials and potentials different to ground. It is thereby possible to set the location of the retardation of the primary electron beam in relation to the object 125. By way of example, if the retardation is carried out quite close to the object 125, imaging aberrations become smaller.

A detector arrangement that includes a first detector 116 and a second detector 117 is arranged in the beam guiding tube 104 for detecting the secondary electrons and/or the backscattered electrons. Here, the first detector 116 is arranged on the source side along the optical axis OA, while the second detector 117 is arranged on the object side along the optical axis OA in the beam guiding tube 104. The first detector 116 and the second detector 117 are arranged offset from one another in the direction of the optical axis OA of the SEM 100. Both the first detector 116 and the second detector 117 each have a passage opening, through which the primary electron beam may pass. The first detector 116 and the second detector 117 are approximately at the potential of the anode 103 and of the beam guiding tube 104. The optical axis OA of the SEM 100 extends through the respective passage openings.

The second detector 117 serves principally for detecting secondary electrons. Upon emerging from the object 125, the secondary electrons initially have a low kinetic energy and random directions of motion. Using the strong extraction field emanating from the tube electrode 113, the secondary electrons are accelerated in the direction of the first objective lens 107. The secondary electrons enter the first objective lens 107 approximately parallel. The beam diameter of the beam of the secondary electrons remains small in the first objective lens 107 as well. The first objective lens 107 then has a strong effect on the secondary electrons and generates a comparatively short focus of the secondary electrons with sufficiently steep angles with respect to the optical axis OA, such that the secondary electrons diverge far apart from one another downstream of the focus and strike the second detector 117 on the active area thereof. By contrast, only a small proportion of electrons that are backscattered at the object 125—that is to say backscattered electrons which have a relatively high kinetic energy in comparison with the secondary electrons upon emerging from the object 125—are detected by the second detector 117. The high kinetic energy and the angles of the backscattered electrons with respect to the optical axis OA upon emerging from the object 125 have the effect that a beam waist, that is to say a beam region having a minimum diameter, of the backscattered electrons lies in the vicinity of the second detector 117. A large portion of the backscattered electrons passes through the passage opening of the second detector 117. Therefore, the first detector 116 substantially serves to detect the backscattered electrons.

In a further embodiment of the SEM 100, the first detector 116 may additionally be embodied with an opposing field grid 116A. The opposing field grid 116A is arranged at the side of the first detector 116 directed toward the object 125. With respect to the potential of the beam guiding tube 104, the opposing field grid 116A has a negative potential such that only backscattered electrons with a high energy pass through the opposing field grid 116A to the first detector 116. In addition or as an alternative thereto, the second detector 117 includes a further opposing field grid, which has an analogous embodiment to the aforementioned opposing field grid 116A of the first detector 116 and which has an analogous function.

Further, the SEM 100 includes in the sample chamber 120 a chamber detector 119, for example an Everhart-Thornley detector or an ion detector, which has a detection surface that is coated with metal and blocks light.

The detection signals generated by the first detector 116, the second detector 117 and the chamber detector 119 are used to generate an image or images of the surface of the object 125.

Reference is explicitly made to the fact that the aperture unit openings of the first aperture unit 108 and of the second aperture unit 109, as well as the passage openings of the first detector 116 and of the second detector 117, are illustrated in exaggerated fashion. The passage openings of the first detector 116 and of the second detector 117 have an extent perpendicular to the optical axis OA in the range of 0.5 mm to 5 mm. By way of example, the passage openings are of circular design and have a diameter in the range of 1 mm to 3 mm perpendicular to the optical axis OA.

The second aperture unit 109 is configured as a pinhole aperture unit in the embodiment illustrated in FIG. 1 and is provided with a second aperture unit opening 118 for the passage of the primary electron beam, which has an extent in the range from 5 μm to 500 μm, e.g., 35 μm. As an alternative thereto, provision is made in a further embodiment for the second aperture unit 109 to be provided with a plurality of aperture unit openings, which can be displaced mechanically with respect to the primary electron beam or which can be reached by the primary electron beam by the use of electrical and/or magnetic deflection elements. The second aperture unit 109 is embodied as a pressure stage aperture unit, which separates a first region, in which the electron source 101 is arranged and in which there is an ultra-high vacuum ($10^{-7}$ hPa to $10^{-12}$ hPa), from a second region, which has a high vacuum ($10^{-3}$ hPa to $10^{-7}$ hPa). The second region is the intermediate pressure region of the beam guiding tube 104, which leads to the sample chamber 120.

The sample chamber 120 is under vacuum. For the purposes of producing the vacuum, a pump (not illustrated) is arranged at the sample chamber 120. In the embodiment illustrated in FIG. 1, the sample chamber 120 is operated in a first pressure range or in a second pressure range. The first pressure range includes only pressures of less than or equal to $10^{-3}$ hPa, and the second pressure range includes only pressures of greater than $10^{-3}$ hPa. To maintain appropriate pressure ranges, the sample chamber 120 is vacuum sealed.

The object holder 114 is arranged at a sample stage 122. The sample stage 122 has movement units such that the object holder 114 is embodied to be movable in three directions arranged perpendicular to one another, specifically in an x-direction (first stage axis), in a y-direction (second stage axis) and in a z-direction (third stage axis). Moreover, the sample stage 122 has movement units such that the object holder 114 can be rotated about two axes of rotation (stage axes of rotation) arranged perpendicular to one another. The invention is not restricted to the sample stage 122 described above. Rather, the sample stage 122 can have further translation axes and axes of rotation along which or about which the object holder 114 can move.

The SEM 100 further includes a third detector 121, which is arranged in the sample chamber 120. More precisely, the third detector 121 is arranged downstream of the sample stage 122, viewed from the electron source 101 along the optical axis OA. The sample stage 122, and hence the object holder 114, can be rotated in such a way that the primary electron beam can radiate through the object 125 arranged on the object holder 114. When the primary electron beam passes through the object 125 to be examined, the electrons of the primary electron beam interact with the material of the object 125 to be examined. The electrons passing through the object 125 to be examined are detected by the third detector 121.

Arranged at the sample chamber 120 is a radiation detector 500, which is used to detect interaction radiation, for example x-ray radiation and/or cathodoluminescence. The radiation detector 500, the first detector 116, the second detector 117, and the chamber detector 119 are connected to a control unit 123, which includes a monitor 124. The third detector 121 is also connected to the control unit 123, which is not illustrated in FIG. 1 for reasons of clarity. The control unit 123 processes detection signals that are generated by the first detector 116, the second detector 117, the chamber detector 119, the third detector 121 and/or the radiation detector 500 and displays the detection signals in the form of images or spectra on the monitor 124.

The control unit 123 furthermore has a database 126, in which data is stored and from which data is read out. Moreover, the control unit 123 includes a processor 127, loaded onto which there is a computer program product with program code which, upon execution, controls the SEM 100 in such a way that the method according to the system described herein is carried out. This is discussed in more detail further below.

The SEM 100 includes a gas feed device 1000, which serves to feed a gaseous precursor to a specific position on the surface of the object 125 and/or of the object holder 114.

The gas feed device 1000 has a gas reservoir in the form of a precursor reservoir 1001. By way of example, the precursor is received as a solid, gaseous or liquid substance in the precursor reservoir 1001. By heating and/or cooling the precursor, the equilibrium between the solid phase, the liquid phase and the gaseous phase is adjusted in such a way that the required vapor pressure is available. By way of example, phenanthrene is used as precursor. Essentially a layer of carbon or a carbon-containing layer then deposits on the surface of the object 125 and/or of the object holder 114. As an alternative thereto, by way of example, a precursor including metal can be used to deposit a metal or a metal-containing layer on the surface of the object 125 and/or of the object holder 114. However, the depositions are not limited to carbon and/or metals. Rather, any desired substance can be deposited on the surface of the object 125 and/or of the object holder 114, for example semiconductors, non-conductors or other compounds. Further, provision is also made for the precursor to be used for ablating material from the object 125 and/or the object holder 114 upon interaction with the particle beam.

The gas feed device 1000 is provided with a feed line 1002. The feed line 1002 has, in the direction of the object 125, an acicular hollow tube 1003, which is able to be brought into the vicinity of the surface of the object 125 and/or of the object holder 114, for example at a distance of 10 µm to 1 mm from the surface of the object 125 and/or the object holder 114. The hollow tube 1003 has a feed opening, the diameter of which is for example in the range of 10 µm to 1000 µm, in particular in the range of 100 µm to 600 µm. The feed line 1002 has a valve 1004 in order to regulate the flow rate of gaseous precursor into the feed line 1002. Expressed differently, when the valve 1004 is opened, gaseous precursor from the precursor reservoir 1001 is introduced into the feed line 1002 and guided via the hollow tube 1003 to the surface of the object 125 and/or the object holder 114. When the valve 1004 is closed, the flow of the gaseous precursor onto the surface of the object 125 and/or of the object holder 114 is stopped.

The gas feed device 1000 is furthermore provided with an adjusting unit 1005, which enables an adjustment of the position of the hollow tube 1003 in all 3 spatial directions—namely an x-direction, a y-direction and a z-direction—and an adjustment of the orientation of the hollow tube 1003 using a rotation and/or a tilting. The gas feed device 1000 and thus also the adjusting unit 1005 are connected to the control unit 123 of the SEM 100.

In further embodiments, the precursor reservoir 1001 is not arranged directly at the gas feed device 1000. Rather, in further embodiments, provision is made for the precursor reservoir 1001 to be arranged for example at a wall of a space in which the SEM 100 is situated.

The gas feed device 1000 includes a temperature measuring unit 1006. By way of example, an infrared measuring apparatus or a semiconductor temperature sensor is used as temperature measuring unit 1006. However, the invention is not restricted to the use of such temperature measuring units. Rather, any suitable temperature measuring unit which is suitable can be used as temperature measuring unit. In particular, provision can be made for the temperature measuring unit 1006 not to be arranged at the gas feed device 1000 itself, but rather to be arranged for example at a distance from the gas feed device 1000.

The gas feed device 1000 further includes a temperature setting unit 1007. By way of example, the temperature setting unit 1007 is a heating device, in particular a conventional infrared heating device. As an alternative thereto, the temperature setting unit 1007 is embodied as a heating and/or cooling device, which includes a heating wire and/or a Peltier element, for example. However, the invention is not restricted to the use of such a temperature setting unit 1007. Rather, any suitable temperature setting unit can be used.

Figure 2:
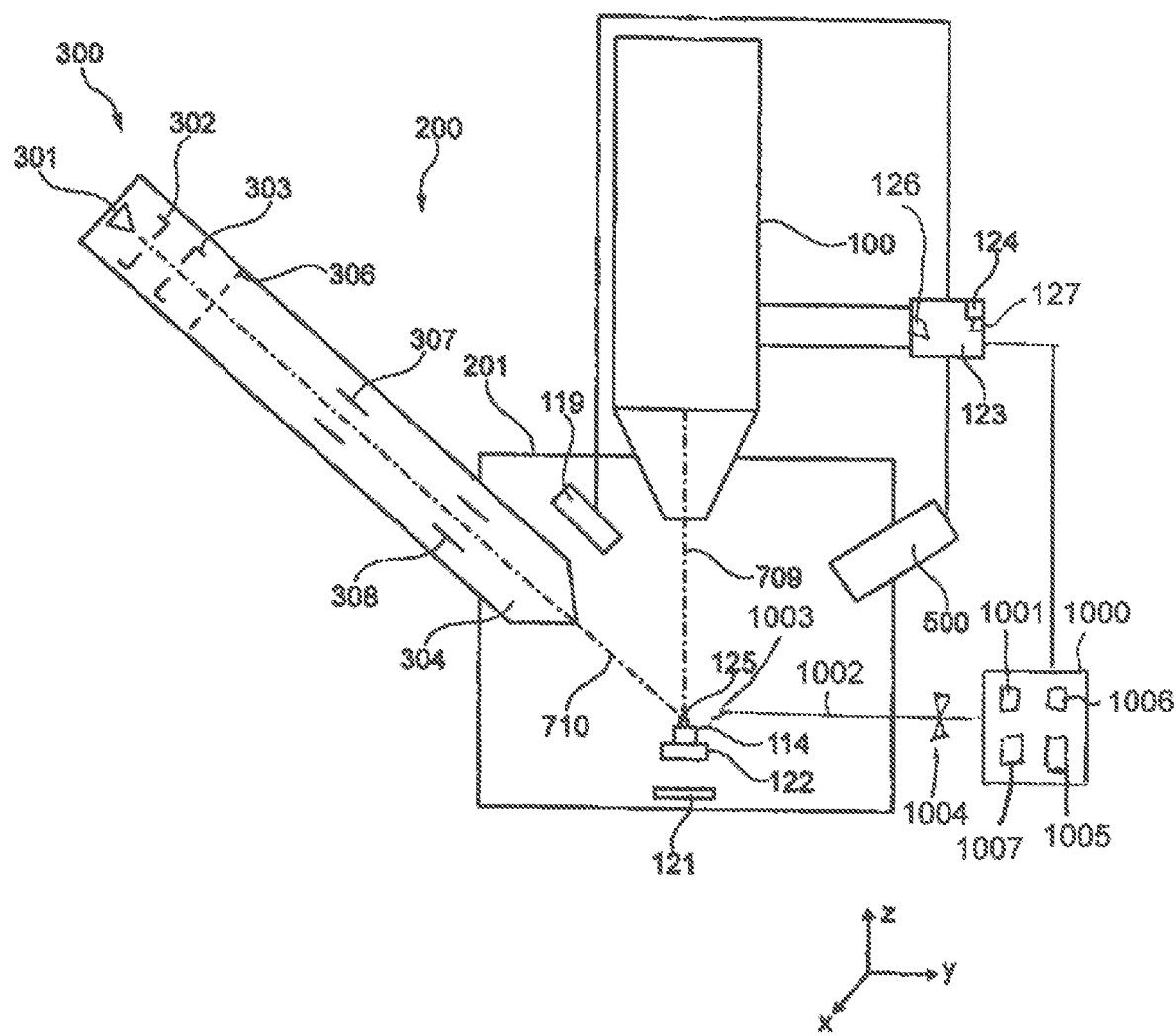
FIG. 2 shows a second embodiment of a particle beam apparatus according to the system described herein.

FIG. 2 shows a particle beam apparatus in the form of a combination apparatus 200. The combination apparatus 200 includes two particle beam columns. Firstly, the combination apparatus 200 is provided with the SEM 100, as already illustrated in FIG. 1, but without the sample chamber 120. Rather, the SEM 100 is arranged at a sample chamber 201. The sample chamber 201 is under vacuum. For the purposes of producing the vacuum, a pump (not illustrated) is arranged at the sample chamber 201. In the embodiment illustrated in FIG. 2, the sample chamber 201 is operated in a first pressure range or in a second pressure range. The first pressure range includes only pressures of less than or equal to $10^{-3}$ hPa, and the second pressure range includes only pressures of greater than $10^{-3}$ hPa. To maintain appropriate pressure ranges, the sample chamber 201 is vacuum-sealed.

Arranged in the sample chamber 201 is the chamber detector 119 which is embodied, for example, in the form of an Everhart-Thornley detector or an ion detector and which has a detection surface coated with metal that blocks light. Further, the third detector 121 is arranged in the sample chamber 201.

The SEM 100 serves to generate a first particle beam, specifically the primary electron beam described above, and has the optical axis, described above, which is provided with the reference sign 709 in FIG. 2 and which is also referred to as first beam axis below. Secondly, the combination apparatus 200 is provided with an ion beam apparatus 300, which is likewise arranged at the sample chamber 201. The ion beam apparatus 300 likewise has an optical axis, which is provided with the reference sign 710 in FIG. 2 and which is also referred to as a second beam axis below.

The SEM 100 is arranged vertically in relation to the sample chamber 201. By contrast, the ion beam apparatus 300 is arranged in a manner inclined by an angle of approximately 0° to 90° in relation to the SEM 100. An arrangement of approximately 50° is illustrated by way of example in FIG. 2. The ion beam apparatus 300 includes a second beam generator in the form of an ion beam generator 301. Ions, which form a second particle beam in the form of an ion beam, are generated by the ion beam generator 301. The ions are accelerated using an extraction electrode 302, which is at a predeterminable potential. The second particle beam then passes through an ion optical unit of the ion beam apparatus 300, where the ion optical unit includes a condenser lens 303 and a second objective lens 304. The second objective lens 304 ultimately generates an ion probe, which is focused onto the object 125 arranged at an object holder 114. The object holder 114 is arranged at a sample stage 122.

An adjustable or selectable aperture unit 306, a first electrode arrangement 307 and a second electrode arrangement 308 are arranged above the second objective lens 304 (i.e., in the direction of the ion beam generator 301), where the first electrode arrangement 307 and the second electrode arrangement 308 are embodied as scanning electrodes. The second particle beam is scanned over the surface of the object 125 using the first electrode arrangement 307 and the second electrode arrangement 308, with the first electrode arrangement 307 acting in a first direction and the second electrode arrangement 308 acting in a second direction, which is counter to the first direction. Thus, scanning is carried out in an x-direction, for example. The scanning in a y-direction perpendicular thereto is brought about by further electrodes (not illustrated), which are rotated by 90°, at the first electrode arrangement 307 and at the second electrode arrangement 308.

As explained above, the object holder 114 is arranged at the sample stage 122. In the embodiment shown in FIG. 2, too, the sample stage 122 has movement units such that the object holder 114 is embodied to be movable in three directions arranged perpendicular to one another, specifically in an x-direction (first stage axis), in a y-direction (second stage axis) and in a z-direction (third stage axis). Moreover, the sample stage 122 has movement units such that the object holder 114 can be rotated about two axes of rotation (stage axes of rotation) arranged perpendicular to one another.

The distances illustrated in FIG. 2 between the individual units of the combination apparatus 200 are illustrated in exaggerated fashion in order to better illustrate the individual units of the combination apparatus 200.

Arranged at the sample chamber 201 is a radiation detector 500, which is used to detect interaction radiation, for example x-ray radiation and/or cathodoluminescence. The radiation detector 500 is connected to a control unit 123, which includes a monitor 124.

The control unit 123 processes detection signals that are generated by the first detector 116, the second detector 117 (not illustrated in FIG. 2), the chamber detector 119, the third detector 121 and/or the radiation detector 500 and displays the detection signals in the form of images or spectra on the monitor 124.

The control unit 123 furthermore has a database 126, in which data is stored and from which data is read out. Moreover, the control unit 123 includes a processor 127, loaded onto which there is a computer program product with program code which, upon execution, controls the combination apparatus 200 in such a way that the method according to the system described herein is carried out. This is discussed in more detail further below.

The combination apparatus 200 includes a gas feed device 1000, which serves to feed a gaseous precursor to a specific position on the surface of the object 125 and/or of the object holder 114. The gas feed device 1000 includes a gas reservoir in the form of a precursor reservoir 1001. By way of example, the precursor is received as a solid, gaseous or liquid substance in the precursor reservoir 1001. By heating and/or cooling the precursor, the equilibrium between the solid phase, the liquid phase and the gaseous phase is adjusted in such a way that the required vapor pressure is available.

By way of example, phenanthrene is used as precursor. Essentially a layer of carbon or a carbon-containing layer then deposits on the surface of the object 125 and/or of the object holder 114. As an alternative thereto, by way of example, a precursor including metal can be used to deposit a metal or a metal-containing layer on the surface of the object 125 and/or of the object holder 114. However, the depositions are not limited to carbon and/or metals. Rather, any desired substance can be deposited on the surface of the object 125 and/or of the object holder 114, for example semiconductors, non-conductors or other compounds. Further, provision is also made for the precursor to be used for ablating material from the object 125 and/or the object holder 114 upon interaction with one of the two particle beams.

The gas feed device 1000 is provided with a feed line 1002. The feed line 1002 has, in the direction of the object 125 and/or the object holder 114, an acicular hollow tube 1003, which is able to be brought into the vicinity of the surface of the object 125 and/or of the object holder 114, for example at a distance of 10 μm to 1 mm from the surface of the object 125 and/or the object holder 114. The hollow tube 1003 has a feed opening, the diameter of which is for example in the range of 10 μm to 1000 μm, in particular in the range of 100 μm to 600 μm. The feed line 1002 has a valve 1004 in order to regulate the flow rate of gaseous precursor into the feed line 1002. Expressed differently, when the valve 1004 is opened, gaseous precursor from the precursor reservoir 1001 is introduced into the feed line 1002 and guided via the hollow tube 1003 to the surface of the object 125 and/or the object holder 114. When the valve 1004 is closed, the flow of the gaseous precursor onto the surface of the object 125 and/or of the object holder 114 is stopped.

The gas feed device 1000 is furthermore provided with an adjusting unit 1005, which enables an adjustment of the position of the hollow tube 1003 in all 3 spatial directions—namely an x-direction, a y-direction and a z-direction—and an adjustment of the orientation of the hollow tube 1003 using a rotation and/or a tilting. The gas feed device 1000 and thus also the adjusting unit 1005 are connected to the control unit 123 of the combination apparatus 200.

In further embodiments, the precursor reservoir 1001 is not arranged directly at the gas feed device 1000. Rather, in further embodiments, provision is made for the precursor reservoir 1001 to be arranged for example at a wall of a space in which the combination apparatus 200 is situated.

The gas feed device 1000 includes a temperature measuring unit 1006. By way of example, an infrared measuring apparatus or a semiconductor temperature sensor is used as temperature measuring unit 1006. However, the invention is not restricted to the use of such temperature measuring units. Rather, any suitable temperature measuring unit which is suitable can be used as temperature measuring unit. In particular, provision can be made for the temperature measuring unit 1006 not to be arranged at the gas feed device 1000 itself, but rather to be arranged for example at a distance from the gas feed device 1000.

The gas feed device 1000 further includes a temperature setting unit 1007. By way of example, the temperature setting unit 1007 is a heating device, in particular a conventional infrared heating device. As an alternative thereto, the temperature setting unit 1007 is embodied as a heating and/or cooling device, which includes a heating wire and/or a Peltier element, for example. However, the invention is not restricted to the use of such a temperature setting unit 1007. Rather, any suitable temperature setting unit can be used.

Figure 3:
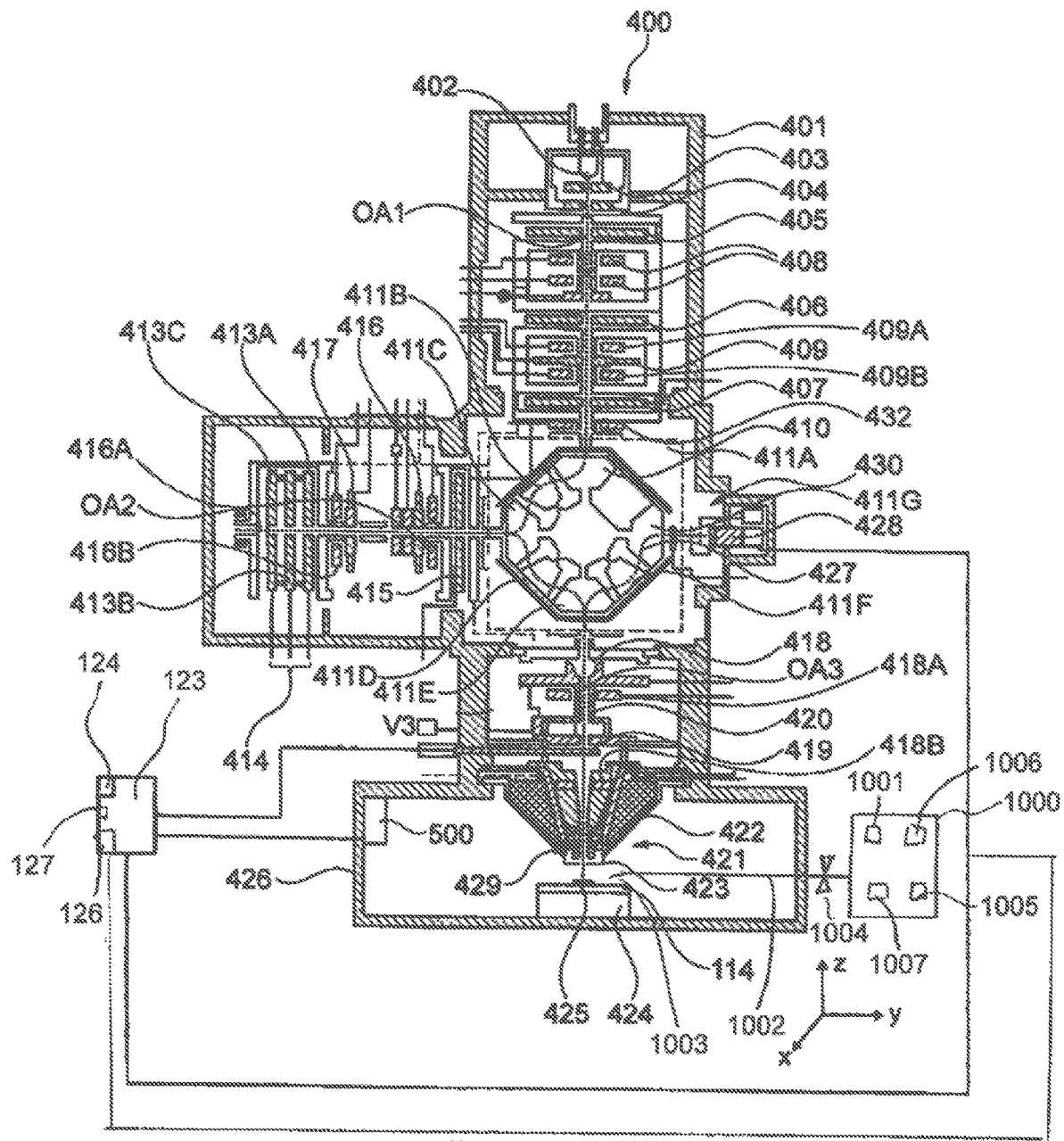
FIG. 3 shows a third embodiment of a particle beam apparatus according to the system described herein.

FIG. 3 is a schematic illustration of a further embodiment of a particle beam apparatus according to the system described herein. This embodiment of the particle beam apparatus is provided with the reference sign 400 and includes a mirror corrector for correcting, e.g., chromatic and/or spherical aberrations. The particle beam apparatus 400 includes a particle beam column 401, which is embodied as an electron beam column and which substantially corresponds to an electron beam column of a corrected SEM. However, the particle beam apparatus 400 is not restricted to an SEM with a mirror corrector. Rather, the particle beam apparatus 400 may include any type of corrector units.

The particle beam column 401 includes a particle beam generator in the form of an electron source 402 (cathode), an extraction electrode 403, and an anode 404. By way of example, the electron source 402 is embodied as a thermal field emitter. Electrons emerging from the electron source 402 are accelerated to the anode 404 on account of a potential difference between the electron source 402 and the anode 404. Accordingly, a particle beam in the form of an electron beam is formed along a first optical axis OA1.

The particle beam is guided along a beam path, which corresponds to the first optical axis OA1, after the particle beam has emerged from the electron source 402. A first electrostatic lens 405, a second electrostatic lens 406, and a third electrostatic lens 407 are used to guide the particle beam.

Furthermore, the particle beam is set along the beam path using a beam guiding device. The beam guiding device of this embodiment includes a source setting unit with two magnetic deflection units 408 arranged along the first optical axis OA1. Moreover, the particle beam apparatus 400 includes electrostatic beam deflection units. A first electrostatic beam deflection unit 409, which is also embodied as a quadrupole in a further embodiment, is arranged between the second electrostatic lens 406 and the third electrostatic lens 407. The first electrostatic beam deflection unit 409 is likewise arranged downstream of the magnetic deflection units 408. A first multi-pole unit 409A in the form of a first magnetic deflection unit is arranged at one side of the first electrostatic beam deflection unit 409. Moreover, a second multi-pole unit 409B in the form of a second magnetic deflection unit is arranged at the other side of the first electrostatic beam deflection unit 409. The first electrostatic beam deflection unit 409, the first multi-pole unit 409A, and the second multi-pole unit 409B are set for the purposes of setting the particle beam with respect to the axis of the third electrostatic lens 407 and the entrance window of a beam deflection device 410. The first electrostatic beam deflection unit 409, the first multi-pole unit 409A and the second multi-pole unit 409B may interact like a Wien filter. A further magnetic deflection element 432 is arranged at the entrance to the beam deflection device 410.

The beam deflection device 410 is used as a particle beam deflector, which deflects the particle beam in a specific manner. The beam deflection device 410 includes a plurality of magnetic sectors, specifically a first magnetic sector 411A, a second magnetic sector 411B, a third magnetic sector 411C, a fourth magnetic sector 411D, a fifth magnetic sector 411E, a sixth magnetic sector 411F, and a seventh magnetic sector 411G. The particle beam enters the beam deflection device 410 along the first optical axis OA1 and the particle beam is deflected by the beam deflection device 410 in the direction of a second optical axis OA2. The beam deflection is performed using the first magnetic sector 411A, the second magnetic sector 411B and the third magnetic sector 411C through an angle of 30° to 120°. The second optical axis OA2 is oriented at the same angle with respect to the first optical axis OA1. The beam deflection device 410 also deflects the particle beam which is guided along the second optical axis OA2, to be precise in the direction of a third optical axis OA3. The beam deflection is provided by the third magnetic sector 411C, the fourth magnetic sector 411D, and the fifth magnetic sector 411E. In the embodiment in FIG. 3, the deflection with respect to the second optical axis OA2 and with respect to the third optical axis OA3 is provided by deflection of the particle beam at an angle of 90°. Hence, the third optical axis OA3 extends coaxially with respect to the first optical axis OA1. However, reference is made to the fact that the particle beam apparatus 400 according to the invention described here is not restricted to deflection angles of 90°. Rather, any suitable deflection angle may be selected by the beam deflection device 410, for example 70° or 110°, such that the first optical axis OA1 does not extend coaxially with respect to the third optical axis OA3. In respect of further details of the beam deflection device 410, reference is made to WO 02/067286 A2.

After the particle beam has been deflected by the first magnetic sector 411A, the second magnetic sector 411B, and the third magnetic sector 411C, the particle beam is guided along the second optical axis OA2. The particle beam is guided to an electrostatic mirror 414 and travels on its path to the electrostatic mirror 414 along a fourth electrostatic lens 415, a third multi-pole unit 416A in the form of a magnetic deflection unit, a second electrostatic beam deflection unit 416, a third electrostatic beam deflection unit 417, and a fourth multi-pole unit 416B in the form of a magnetic deflection unit. The electrostatic mirror 414 includes a first mirror electrode 413A, a second mirror electrode 413B, and a third mirror electrode 413C. Electrons of the particle beam which are reflected back at the electrostatic mirror 414 once again travel along the second optical axis OA2 and re-enter the beam deflection device 410. Then, the electrons are deflected to the third optical axis OA3 by the third magnetic sector 411C, the fourth magnetic sector 411D, and the fifth magnetic sector 411E.

The electrons of the particle beam emerge from the beam deflection device 410 and the electrons are guided along the third optical axis OA3 to an object 425 that is intended to be examined and is arranged in an object holder 114. On the path to the object 425, the particle beam is guided to a fifth electrostatic lens 418, a beam guiding tube 420, a fifth multi-pole unit 418A, a sixth multi-pole unit 418B, and an objective lens 421. The fifth electrostatic lens 418 is an electrostatic immersion lens. By way of the fifth electrostatic lens 418, the particle beam is decelerated or accelerated to an electric potential of the beam guiding tube 420.

Using the objective lens 421, the particle beam is focused into a focal plane in which the object 425 is arranged. The object holder 114 is arranged at a movable sample stage 424. The movable sample stage 424 is arranged in a sample chamber 426 of the particle beam apparatus 400. The sample stage 424 has movement units such that the object holder 114 is embodied to be movable in three directions arranged perpendicular to one another, specifically in an x-direction (first stage axis), in a y-direction (second stage axis) and in a z-direction (third stage axis). Moreover, the sample stage 424 has movement units such that the object holder 114 can be rotated about two axes of rotation (stage axes of rotation) arranged perpendicular to one another.

The sample chamber 426 is under vacuum. For the purposes of producing the vacuum, a pump (not illustrated) is arranged at the sample chamber 426. In the embodiment illustrated in FIG. 3, the sample chamber 426 is operated in a first pressure range or in a second pressure range. The first pressure range includes only pressures of less than or equal to $10^{-3}$ hPa, and the second pressure range includes only pressures of greater than $10^{-3}$ hPa. To maintain appropriate pressure ranges, the sample chamber 426 is vacuum sealed.

The objective lens 421 may be embodied as a combination of a magnetic lens 422 and a sixth electrostatic lens 423. The end of the beam guiding tube 420 further may be an electrode of an electrostatic lens. After emerging from the beam guiding tube 420, particles of the particle beam apparatus are decelerated to a potential of the object 425. The objective lens 421 is not restricted to a combination of the magnetic lens 422 and the sixth electrostatic lens 423. Rather, the objective lens 421 may assume any suitable embodiment. By way of example, the objective lens 421 also may be embodied as a purely magnetic lens or as a purely electrostatic lens.

The particle beam which is focused onto the object 425 interacts with the object 425. Interaction particles are generated. In particular, secondary electrons are emitted from the object 425 or backscattered electrons are backscattered at the object 425. The secondary electrons or the backscattered electrons are accelerated again and guided into the beam guiding tube 420 along the third optical axis OA3. In particular, the trajectories of the secondary electrons and the backscattered electrons extend on the route of the beam path of the particle beam in the opposite direction to the particle beam.

The particle beam apparatus 400 includes a first analysis detector 419, which is arranged between the beam deflection device 410 and the objective lens 421 along the beam path. Secondary electrons travelling in directions oriented at a large angle with respect to the third optical axis OA3 are detected by the first analysis detector 419. Backscattered electrons and secondary electrons which have a small axial distance with respect to the third optical axis OA3 at the location of the first analysis detector 419—i.e., backscattered electrons and secondary electrons which have a small distance from the third optical axis OA3 at the location of the first analysis detector 419—enter the beam deflection device 410 and are deflected to a second analysis detector 428 by the fifth magnetic sector 411E, the sixth magnetic sector 411F and the seventh magnetic sector 411G along a detection beam path 427. By way of example, the deflection angle is 90° or 110°.

The first analysis detector 419 generates detection signals which are largely generated by emitted secondary electrons. The detection signals which are generated by the first analysis detector 419 are guided to a control unit 123 and are used to obtain information about the properties of the interaction region of the focused particle beam with the object 425. In particular, the focused particle beam is scanned over the object 425 using a scanning device 429. Using the detection signals generated by the first analysis detector 419, an image of the scanned region of the object 425 can then be generated and displayed on a display unit. The display unit is, for example, a monitor 124 that is arranged at the control unit 123.

The second analysis detector 428 is also connected to the control unit 123. Detection signals of the second analysis detector 428 are passed to the control unit 123 and used to generate an image of the scanned region of the object 425 and to display the image on a display unit. The display unit is for example the monitor 124 that is arranged at the control unit 123.

Arranged at the sample chamber 426 is a radiation detector 500, which is used to detect interaction radiation, for example x-ray radiation and/or cathodoluminescence. The radiation detector 500 is connected to the control unit 123, which includes the monitor 124. The control unit 123 processes detection signals of the radiation detector 500 and displays the detection signals in the form of images and/or spectra on the monitor 124.

The control unit 123 furthermore has a database 126, in which data is stored and from which data is read out. Moreover, the control unit 123 includes a processor 127, loaded onto which there is a computer program product with program code which, upon execution, controls the particle beam apparatus 400 in such a way that the method according to the system described herein is carried out. This is discussed in more detail further below.

The particle beam apparatus 400 includes a gas feed device 1000, which serves to feed a gaseous precursor to a specific position on the surface of the object 425 and/or of the object holder 114. The gas feed device 1000 includes a gas reservoir in the form of a precursor reservoir 1001. By way of example, the precursor is received as a solid, gaseous or liquid substance in the precursor reservoir 1001. By heating and/or cooling the precursor, the equilibrium between the solid phase, the liquid phase and the gaseous phase is adjusted in such a way that the required vapor pressure is available.

By way of example, phenanthrene is used as precursor. Essentially a layer of carbon or a carbon-containing layer then deposits on the surface of the object 425 and/or of the object holder 114. As an alternative thereto, by way of example, a precursor including metal can be used to deposit a metal or a metal-containing layer on the surface of the object 425 and/or of the object holder 114. However, the depositions are not limited to carbon and/or metals. Rather, any desired substance can be deposited on the surface of the object 425 and/or of the object holder 114, for example semiconductors, non-conductors or other compounds. Further, provision is also made for the precursor to be used for ablating material from the object 425 and/or the object holder 114 upon interaction with a particle beam.

The gas feed device 1000 is provided with a feed line 1002. The feed line 1002 has, in the direction of the object 425 and/or the object holder 114, an acicular hollow tube 1003, which is able to be brought into the vicinity of the surface of the object 425 and/or of the object holder 114, for example at a distance of 10 μm to 1 mm from the surface of the object 425 and/or the object holder 114. The hollow tube 1003 has a feed opening, the diameter of which is for example in the range of 10 μm to 1000 μm, in particular in the range of 100 μm to 600 μm. The feed line 1002 has a valve 1004 in order to regulate the flow rate of gaseous precursor into the feed line 1002. Expressed differently, when the valve 1004 is opened, gaseous precursor from the precursor reservoir 1001 is introduced into the feed line 1002 and guided via the hollow tube 1003 to the surface of the object 425 and/or the object holder 114. When the valve 1004 is closed, the flow of the gaseous precursor onto the surface of the object 425 and/or of the object holder 114 is stopped.

The gas feed device 1000 is furthermore provided with an adjusting unit 1005, which enables an adjustment of the position of the hollow tube 1003 in all 3 spatial directions— namely an x-direction, a y-direction and a z-direction—and an adjustment of the orientation of the hollow tube 1003 using a rotation and/or a tilting. The gas feed device 1000 and thus also the adjusting unit 1005 are connected to the control unit 123 of the particle beam apparatus 400.

In further embodiments, the precursor reservoir 1001 is not arranged directly at the gas feed device 1000. Rather, in further embodiments, provision is made for the precursor reservoir 1001 to be arranged for example at a wall of a space in which the particle beam apparatus 400 is situated.

The gas feed device 1000 includes a temperature measuring unit 1006. By way of example, an infrared measuring apparatus or a semiconductor temperature sensor is used as temperature measuring unit 1006. However, the invention is not restricted to the use of such temperature measuring units. Rather, any suitable temperature measuring unit can be used as temperature measuring unit. In particular, provision can be made for the temperature measuring unit 1006 not to be arranged at the gas feed device 1000 itself, but rather to be arranged for example at a distance from the gas feed device 1000.

The gas feed device 1000 further includes a temperature setting unit 1007. By way of example, the temperature setting unit 1007 is a heating device, in particular a conventional infrared heating device. As an alternative thereto, the temperature setting unit 1007 is embodied as a heating and/or cooling device, which includes a heating wire and/or a Peltier element, for example. However, the invention is not restricted to the use of such a temperature setting unit 1007. Rather, any suitable temperature setting unit can be used.

Now, the sample stage 122 of the SEM 100, the sample stage 122 of the combination apparatus 200 and the sample stage 424 of the particle beam apparatus 400 are discussed below. The sample stage 122, 424 is embodied as a sample stage with movement units, which is illustrated schematically in FIGS. 4 and 5. Reference is made to the fact that the invention is not restricted to the sample stage 122, 424 described here. Rather, the invention can use any movable sample stage that is suitable.

Arranged on the sample stage 122, 424 is the object holder 114 with the object 125, 425. The sample stage 122, 424 has movement units that ensure a movement of the object holder 114 in such a way that a region of interest on the object 125, 425 can be examined by a particle beam. The movement units are illustrated schematically in FIGS. 4 and 5 and are explained below.

The sample stage 122, 424 has a first movement unit 600 on a housing 601 of the sample chamber 120, 201, 426, in which the sample stage 122, 424 is arranged. The first movement unit 600 enables a movement of the object holder 114 along the z-axis (third stage axis). Further, provision is made for a second movement unit 602. The second movement unit 602 enables a rotation of the object holder 114 about a first stage axis of rotation 603, which is also referred to as a tilt axis. This second movement unit 602 serves to tilt the object 125, 425 about the first stage axis of rotation 603.

Arranged on the second movement unit 602, in turn, is a third movement unit 604 that is embodied as a guide for a slide and that ensures that the object holder 114 is movable in the x-direction (first stage axis). The aforementioned slide is a further movement unit in turn, specifically a fourth movement unit 605. The fourth movement unit 605 is embodied in such a way that the object holder 114 is movable in the y-direction (second stage axis). To this end, the fourth movement unit 605 has a guide in which a further slide is guided, a holder 609 with the object holder 114 and the object 125, 425 in turn being arranged on the further slide.

The holder 609 is embodied, in turn, with a fifth movement unit 606 that facilitates a rotation of the holder 609 about a second stage axis of rotation 607. The second stage axis of rotation 607 is oriented perpendicular to the first stage axis of rotation 603.

Figure 4:
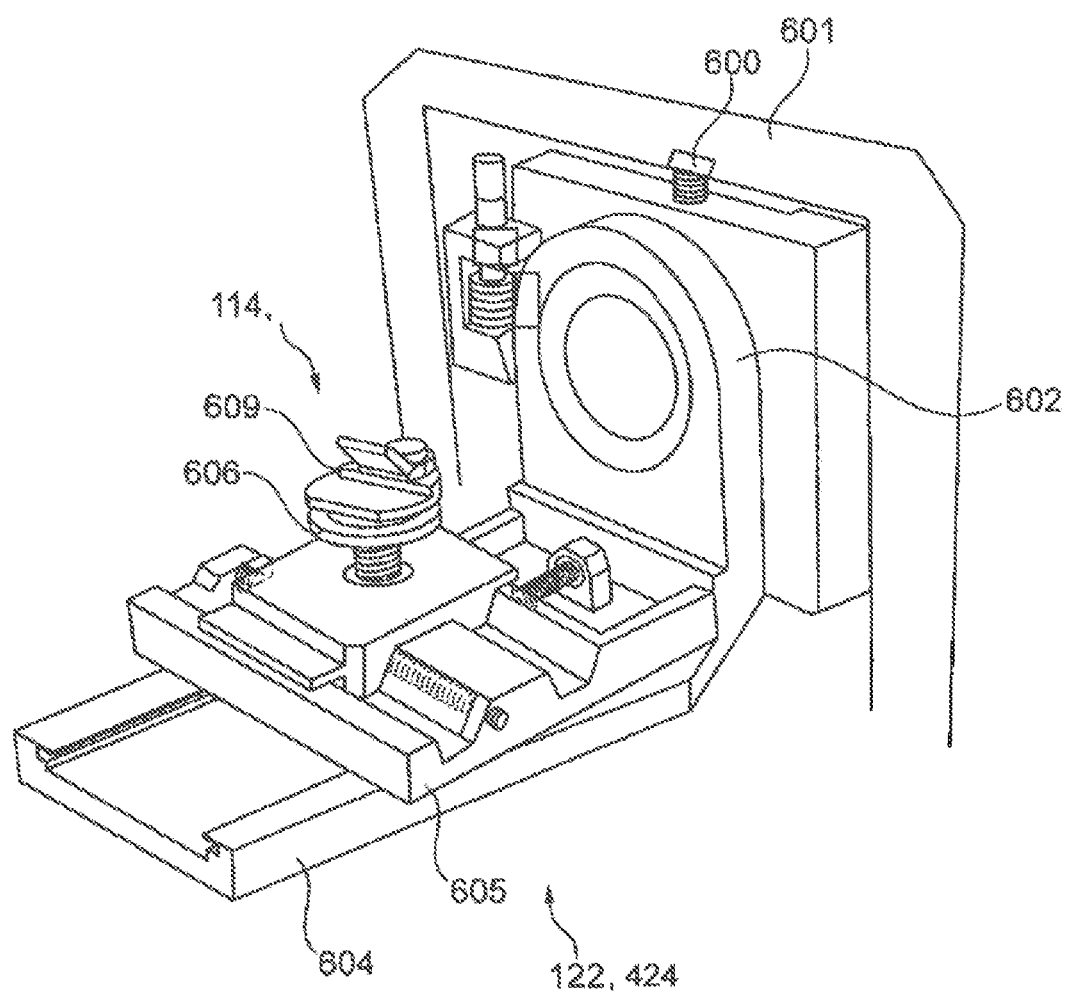
FIG. 4 shows a schematic illustration of a sample stage of a particle beam apparatus according to the system described herein.

On account of the above-described arrangement, the sample stage 122, 424 of the embodiment discussed in connection with FIG. 4 and FIG. 5 has the following kinematic chain: first movement unit 600 (movement along the z-axis)—second movement unit 602 (rotation about the first stage axis of rotation 603)—third movement unit 604 (movement along the x-axis)—fourth movement unit 605 (movement along the y-axis)—fifth movement unit 606 (rotation about the second stage axis of rotation 607).

In a further embodiment (not illustrated), provision is made for further movement units to be arranged at the sample stage 122, 424 such that movements along further translational axes and/or about further axes of rotation are made possible.

Figure 5:
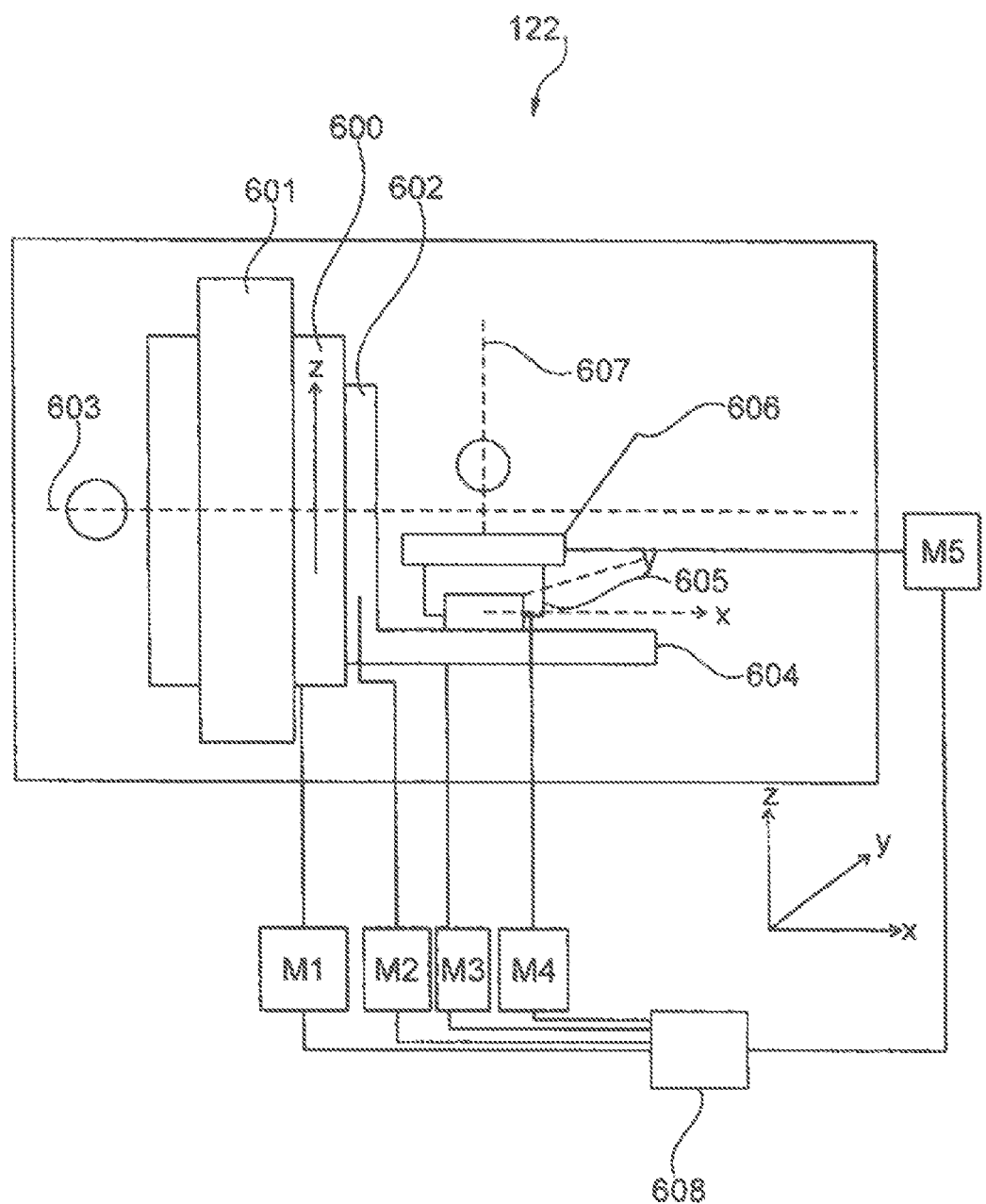
FIG. 5 shows a further schematic illustration of the sample stage according to FIG. 4.

It is clear from FIG. 5 that each of the aforementioned movement units is connected to a stepper motor. Thus, the first movement unit 600 is connected to a first stepper motor M1 and driven on account of a driving force that is provided by the first stepper motor M1. The second movement unit 602 is connected to a second stepper motor M2, which drives the second movement unit 602. The third movement unit 604 is connected, in turn, to a third stepper motor M3. The third stepper motor M3 provides a driving force for driving the third movement unit 604. The fourth movement unit 605 is connected to a fourth stepper motor M4, where the fourth stepper motor M4 drives the fourth movement unit 605. Further, the fifth movement unit 606 is connected to a fifth stepper motor M5. The fifth stepper motor M5 provides a driving force that drives the fifth movement unit 606. The aforementioned stepper motors M1 to M5 are controlled by a control unit 608 (see FIG. 5).

Figure 6:
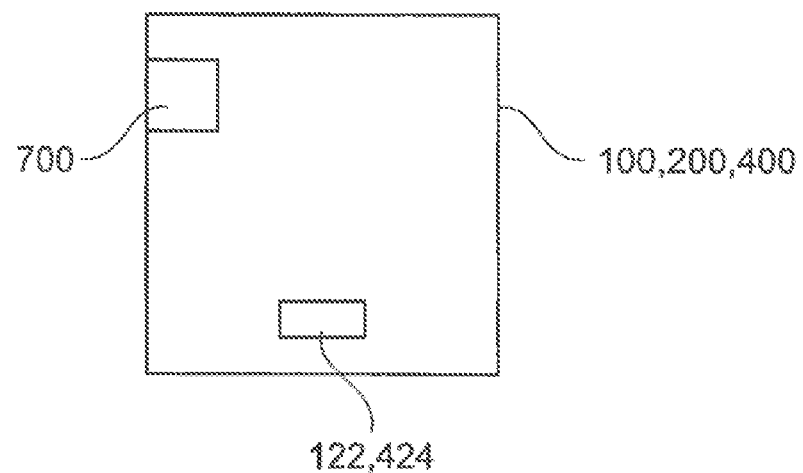
FIG. 6 shows a schematic illustration of a particle beam apparatus with a laser beam device according to the system described herein.
Figure 7:
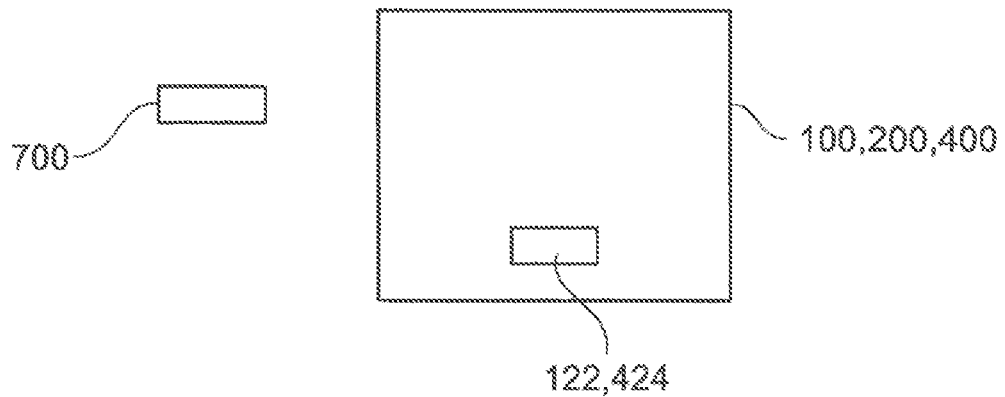
FIG. 7 shows a schematic illustration of a system with a particle beam apparatus and a laser beam device according to the system described herein.

FIG. 6 shows a schematic illustration of a further embodiment of the SEM 100, the combination apparatus 200 and the particle beam apparatus 400 with the sample stage 122, 424. The embodiment of FIG. 6 includes a laser beam device 700, which is arranged in and/or on the SEM 100, the combination apparatus 200 and the particle beam apparatus 400. FIG. 7 shows a schematic illustration of yet a further embodiment of the SEM 100, the combination apparatus 200 and the particle beam apparatus 400 with the sample stage 122, 424. In this embodiment, the laser beam device 700 is not arranged in or on the SEM 100, the combination apparatus 200 and the particle beam apparatus 400. Rather, the laser beam device 700 is a separate device from the SEM 100, the combination apparatus 200 and the particle beam apparatus 400.

Embodiments of the method according to the system described herein are explained in more detail below in relation to the combination apparatus 200. The method according to the system described herein is carried out in analogous fashion in relation to the SEM 100 and/or the particle beam apparatus 400.

Figure 8:
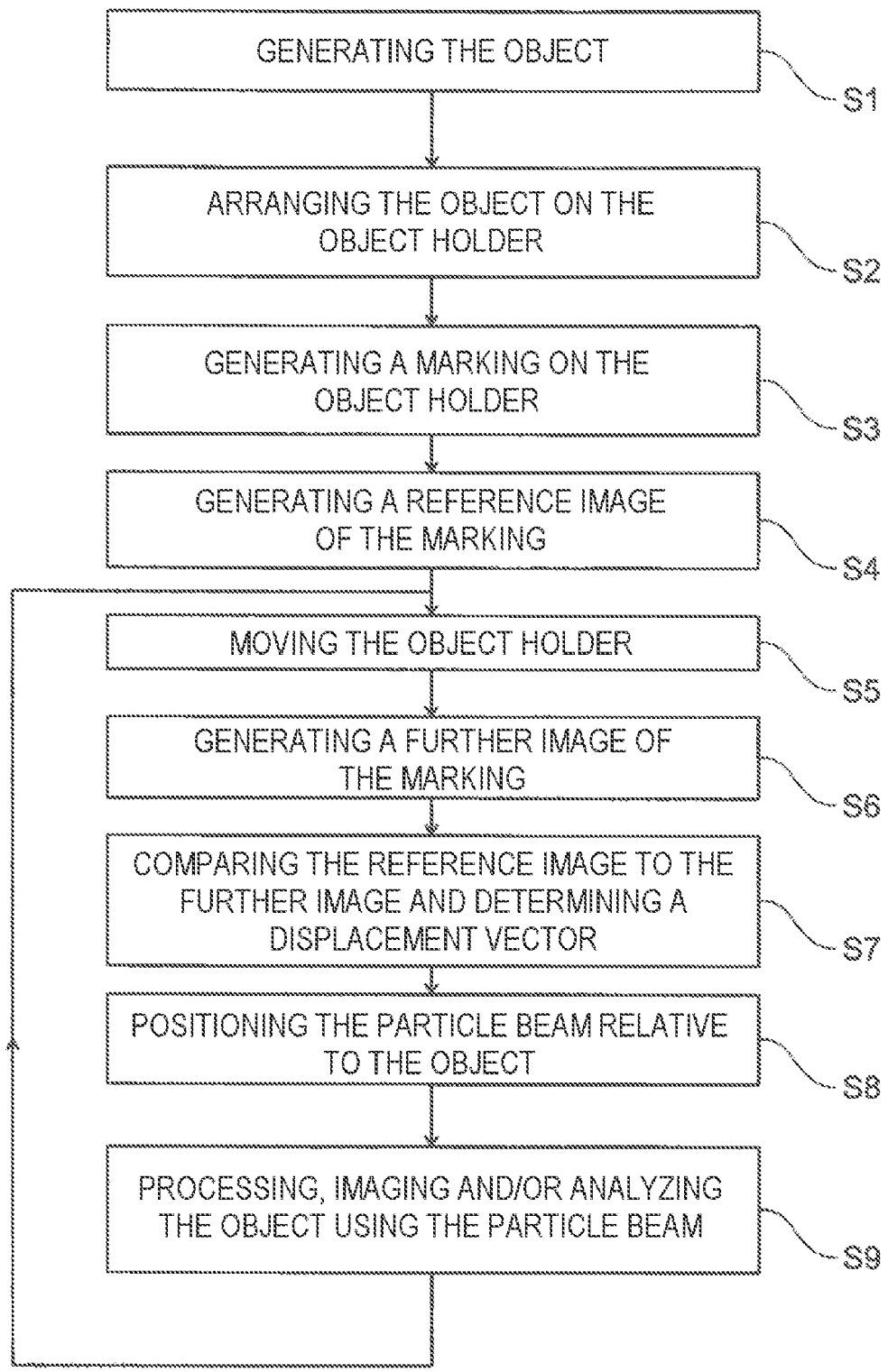
FIG. 8 shows a schematic illustration of a procedure of an embodiment of a method for operating a particle beam apparatus according to the system described herein.

FIG. 8 shows a schematic illustration of a procedure of one embodiment of the method according to the system described herein. The object 125 intended for subsequent processing, imaging and/or analysis is initially generated in a method step S1. By way of example, in this embodiment of the method according to the system described herein, the object 125 in the form of a portion of a material piece is exposed in the material piece using the ion beam of the combination apparatus 200, and extracted from the material piece. By way of example, the exposure is implemented by ablating material from the material piece using the ion beam. To this end, for example, a gas can be fed to the material piece via the feed line 1002 of the gas feed device 1000, which interacts with the ion beam and the material of the material piece in such a way that material is ablated from the material piece. By way of example, the material piece has extents in the millimeter range. By contrast, the extracted object 125 in the form of the portion has a thickness of a few micrometers (in particular 3 µm to 6 µm), for example, and a length of a few 10 µm (in particular 30 µm to 80 µm), for example.

In a further method step S2, the extracted object 125 is arranged on the object holder 114. To this end, for example, the extracted object 125 is fastened to a micromanipulator (not illustrated) and lifted out of the material piece. By way of example, fastening is implemented by feeding a gas of the gas feed device 1000 to a connecting site of the object 125 with the micromanipulator. On account of an interaction of the ion beam with the gas, material is applied to the connecting site in such a way that the extracted object 125 is fastened to the micromanipulator. Thereupon, the object 125 is arranged on the object holder 114. To this end, the object 125 is fastened to the object holder 114 and detached from the micromanipulator again. By way of example, fastening to the object holder 114 is implemented in turn by feeding a gas of the gas feed device 1000 to a connecting site of the object 125 with the object holder 114. On account of an interaction of the ion beam with the gas, material is applied to the connecting site in such a way that the object 125 is fastened to the object holder 114. By way of example, the object 125 is detached again by feeding a gas of the gas feed device 1000 to the connecting site of the object 125 with the micromanipulator. On account of an interaction of the ion beam with the gas, material is ablated from the connecting site in such a way that the object 125 is detached from the micromanipulator. As an alternative thereto, to detach the object 125 from the micromanipulator, use is only made of the ion beam with which material is ablated from the connecting site of the object 125 with the micromanipulator. In a further embodiment of the method according to the system described herein, provision is additionally or alternatively made for the object 125 to be arranged directly on the object holder 114 without implementing the intermediate step, specifically arranging the object 125 on the micromanipulator.

Figure 9:
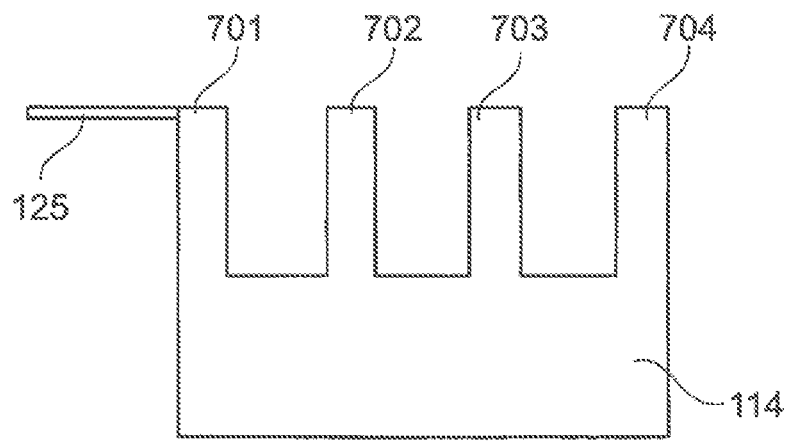
FIG. 9 shows a schematic illustration of a side view of an object holder according to the system described herein.

FIG. 9 shows a schematic illustration of a side view of the object holder 114. The object holder 114 includes a first holding device 701, a second holding device 702, a third holding device 703 and a fourth holding device 704. The aforementioned holding devices 701-704 are arranged at a distance from one another and serve to arrange the object 125. In the embodiment of the object holder 114 illustrated in FIG. 9, the object 125 is arranged on the first holding device 701. By way of example, the object 125 is arranged on the first holding device 701 according to the method steps explained above. By way of example, provision is made for the object holder 114 to be embodied to feed charged particles to the object 125, the charged particles transmitting through the object 125. In particular, the charged particles are electrons or ions. Further, by way of example, provision is made for the object holder 114 to be embodied as a TEM object holder which can be used for further imaging and analysis of the object 125 in a TEM (not illustrated). In addition or as an alternative thereto, provision is made for the object holder 114 to remain inserted in the combination apparatus 200 and for an analysis of the object 125 to be implemented using the third detector 121. Explicit reference is made to the fact that the method according to the invention is not restricted to the aforementioned embodiment of the object holder 114. Rather, use can be made of any object holder that is suitable for carrying out the method described herein.

Figure 10:
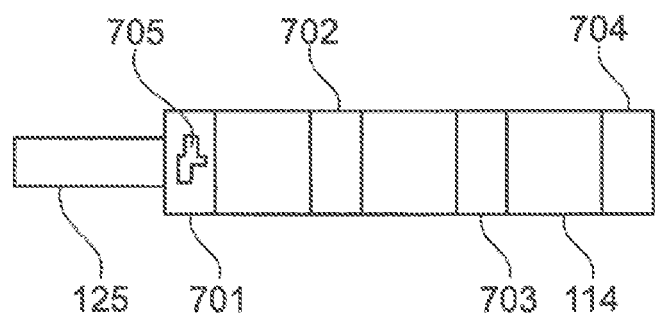
FIG. 10 shows a schematic illustration of a plan view of the object holder according to FIG. 9.

At least one marking is arranged on the object holder 114 in a method step S3. Expressed differently, at least one marking is generated on the object holder 114. The method step S3 can also be implemented before or during the method step S2. By way of example, the marking is generated using the laser beam of the laser beam device 700, which may be implemented in the combination apparatus 200 (cf. FIG. 6). As an alternative thereto, the object holder 114 can be unloaded from the combination apparatus 200, for example. Subsequently, the marking on the object holder 114 is generated using the laser beam device 700 (cf. FIG. 7). Material is ablated from the object holder 114 in such a way using the laser beam device 700 that the marking is generated. In addition or as an alternative thereto, provision is made for material to be ablated from the object holder 114 and/or for material to be applied to the object holder 114 in such a way using the ion beam, for example, that the marking is generated by the ablation of material and/or the application of material. By way of example, a gas is fed to the object holder 114 by the gas feed device 1000 for the purposes of applying material and/or ablating material. The ion beam and/or the laser beam interact/interacts with the gas and the material of the object holder 114 in such a way that material is applied to the object holder 114 or ablated from the object holder 114. FIG. 10 shows a plan view of the object holder 114 as per FIG. 9. In the method according to the system described herein, a marking 705 is arranged on the first holding device 701 in the method step S3. By way of example, the marking 705 is generated as a marking with at least one edge, from where a first plane extends in a first dimension and a second plane extends in a second dimension. In particular, provision is made for the marking 705 to be generated as a marking with at least one first edge and with at least one second edge, where from both the first edge and from the second edge a first plane extends in a first dimension in each case and a second plane extends in a second dimension in each case. By way of example, the first planes are different from one another in each case. Further, the second planes are for example different from one another in each case. In addition or as an alternative thereto, the marking 705 is generated as a cross-shaped marking. Further additionally or in a further alternative thereto, the marking 705 is generated as a star-shaped marking. In a further embodiment of the method according to the system described herein, the marking 705 is generated as an X-shaped marking and/or as an L-shaped marking and/or as a polygon.

In a method step S4, a reference image that includes the marking 705 is generated using the ion beam. To this end, the ion beam is guided on the marking 705 arranged on the object holder 114. Interaction particles, in particular secondary electrons, are generated on account of an interaction of the ion beam with the marking 705. By way of example, the interaction particles are detected using the chamber detector 119. The detection signals generated by the chamber detector 119 are guided to the control unit 123 for the purposes of generating the reference image that includes the marking 705. As an alternative thereto, provision is made for the reference image that includes the marking 705 to be generated using the electron beam. To this end, the electron beam is guided on the marking 705 arranged on the object holder 114. Interaction particles, in particular secondary electrons and backscattered electrons, are generated on account of an interaction of the electron beam with the marking 705. The interaction particles are detected using the chamber detector 119, the first detector 116 and/or the second detector 117. The detection signals generated by the chamber detector 119, the first detector 116 and/or the second detector 117 are guided to the control unit 123 for the purposes of generating the reference image that includes the marking 705.

The object holder 114 is moved with the sample stage 122 in a method step S5. By way of example, the movement of the object holder 114 includes a translational movement of the object holder 114 along the x-axis, along the y-axis and/or along the z-axis. In addition or as an alternative thereto, provision is made for the object holder 114 to be rotated about the first stage axis of rotation 603 and/or about the second stage axis of rotation 607. In particular, the aforementioned rotations include a tilt of the object holder 114. In particular, provision is made for the object holder 114 and the object 125 arranged on the object holder 114 to be rotated through 0.5° to 5°, in particular through 1° to 3° or through 1° to 2°, about the first stage axis of rotation 603 and/or the second stage axis of rotation 607 from an initial position. The aforementioned range boundaries of the angular ranges are included in the angular ranges. Explicit reference is made to the fact that the invention is not restricted to the aforementioned angular ranges. Rather, any suitable angular range can be used.

A further image that includes the marking 705 is generated in a method step S6. Expressed differently, a further image that includes the marking 705 is generated by imaging the marking 705 again. To this end, the ion beam is guided on the marking 705 arranged on the object holder 114. Interaction particles, in particular secondary electrons, are generated on account of an interaction of the ion beam with the marking 705. By way of example, the interaction particles are detected using the chamber detector 119. The detection signals generated by the chamber detector 119 are guided to the control unit 123 for the purposes of generating the further image that includes the marking 705. As an alternative thereto, provision is made for the further image that includes the marking 705 to be generated using the electron beam. To this end, the electron beam is guided on the marking 705 arranged on the object holder 114. Interaction particles, in particular secondary electrons and backscattered electrons, are generated on account of an interaction of the electron beam with the marking 705. The interaction particles are detected using the chamber detector 119, the first detector 116 and/or the second detector 117. The detection signals generated by the chamber detector 119, the first detector 116 and/or the second detector 117 are guided to the control unit 123 for the purposes of generating the further image that includes the marking 705.

In one embodiment of the method according to the system described herein, both the reference image that includes the marking 705 and the further image that includes the marking 705 are generated by the ion beam in each case. In an alternative embodiment of the method according to the system described herein, the reference image that includes the marking 705 and the further image that includes the marking 705 are generated by the electron beam in each case.

By way of example, the generation of the reference image that includes the marking 705 and the further image that includes the marking 705 is implemented automatically. The marking 705 is identified automatically and the region of the marking 705 is imaged using the ion beam and/or the electron beam.

In a method step S7 there is a comparison of the reference image that includes the marking 705 with the further image that includes the marking 705. By way of example, image recognition software is used to this end. Subsequently, a displacement vector is determined using the comparison of the reference image that includes the marking 705 with the further image that includes the marking 705. By way of example, the mathematical method of cross correlation is used when determining the displacement vector. In the method according to the system described herein, the displacement of the ion beam and/or of the electron beam obtained by the movement of the object holder 114 in relation to the object 125 can be significantly greater than a rotation in relation to the object 125. Therefore, only a displacement vector is determined in the embodiment illustrated here and the rotation is not taken into account. In addition or as an alternative thereto, provision is also made for the rotation to be taken into account.

An embodiment of the method according to the system described herein using cross correlation is explained in more detail below. In the following embodiment of the method according to the system described herein, the marking 705 is embodied as a polygon with edges. In particular, (a) the reference image that includes the marking 705 is generated, (b) the further image that includes the marking 705 is generated after the object holder 114 has been moved and (c) a displacement between the reference image that includes the marking 705 and the further image that includes the marking 705 is calculated using the processor 127.

The marking 705 can be defined by the coordinates $x_i, y_i$ of each node of the marking 705 in the form of the polygon. Using the coordinates of each node, the center of the area of the marking 705 can be calculated using the processor 127 using the following equations:

$$C_x = \frac{1}{6A} \sum_{i=0}^{n-1} (x_i + x_{i+1}) \cdot (x_i \cdot y_{i+1} - x_{i+1} \cdot y_i) \quad [1]$$

$$C_y = \frac{1}{6A} \sum_{i=0}^{n-1} (y_i + y_{i+1}) \cdot (x_i \cdot y_{i+1} - x_{i+1} \cdot y_i) \quad [2]$$

where A is the area of the polygon given by $$A = \tfrac{1}{2} \Sigma_{i=0}^{n-1} (x_i y_{i+1} - x_{i+1} y_i) \quad [3]$$

The center of the area of the marking 705 in the form of the polygon is given by the coordinates $C_x, C_y$. The center of the area of the marking 705 in the reference image is compared to the center of the area of the marking 705 in the further image.

On account of imprecision in the mechanism of the movement units of the sample stage 122, there can be an unwanted relative displacement of the position of the ion beam and of the object 125 arranged on the object holder 114 in the case of the movement of the object holder 114. Expressed differently, following the movement of the object holder 114, the ion beam no longer strikes the object 125 arranged on the object holder 114 at the site on which the ion beam was focused prior to the movement of the object holder 114. In this case, the ion beam must be positioned relative to the object 125 in such a way that the ion beam strikes the desired site of the object 125, for example in order to be able to ablate material or analyze the object 125. By way of example, relative positioning of the ion beam in relation to the object 125 is implemented by readjusting (i.e., positioning) the ion beam (for example using the first electrode arrangement 307 and/or the second electrode arrangement 308 and/or the second objective lens 304) and/or by moving the object holder 114. Moving the object holder 114 allows relatively large displacements of several μm to be compensated. The aforementioned applies analogously to the electron beam as well. Following the movement of the object holder 114, the electron beam no longer strikes the object 125 arranged on the object holder 114 at the site on which the electron beam was focused prior to the movement of the object holder 114. By way of example, relative positioning of the electron beam in relation to the object 125 is implemented by readjusting (i.e., positioning) the electron beam (for example using the first condenser lens 105 and/or the second condenser lens 106 and/or the first objective lens 107 and/or the scanning device 115 of the SEM 100) and/or by moving the object holder 114. Moving the object holder 114 allows relatively large displacements of several μm to be compensated. Then, the electron beam strikes the desired site of the object 125 again, for example in order to be able to image and/or examine the object 125.

As an alternative thereto, the electron beam can be used for imaging the marking 705 while the ion beam is used to process the object 125. Here, the relative position of the ion beam with respect to the electron beam is set such that a correction of the displacement of the electron beam relative to the object 125 can be converted into a correction of the displacement of the ion beam relative to the object 125.

A possible displacement of the center of the area is determined by correlating the reference image that includes the marking 705 with the further image that includes the marking 705. The displacement is specified by a displacement vector $(d_x, d_y)$.

Then, how the ion beam and/or the electron beam should be positioned in order to be incident again on the site of the object 125 on which the ion beam and/or the electron beam were/was incident prior to the movement of the object holder 114 is determined using the displacement vector $(d_x, d_y)$. The corresponding coordinates of the site on which the ion beam and/or the electron beam are/is now focused are specified for example as follows:

$$\begin{pmatrix} x_i^* \\ y_i^* \end{pmatrix} = \begin{pmatrix} x_i \\ y_i \end{pmatrix} + \begin{pmatrix} d_x \\ d_y \end{pmatrix} \quad [4]$$

The ion beam and/or the electron beam are/is now positioned relative to the object 125 using the marking 705 in a method step S8. Expressed differently, following the movement of the object holder 114, the ion beam and/or the electron beam are/is positioned in such a relative fashion by displacement that the ion beam and/or the electron beam are/is able to be guided to the site on the object 125 on which the ion beam and/or the electron beam were/was focused before the movement of the object holder 114. To this end, use is made of the previously determined displacement vector. By way of example, relative positioning of the ion beam in relation to the object 125 is implemented by readjusting (i.e., positioning) the ion beam (for example using the first electrode arrangement 307 and/or the second electrode arrangement 308 and/or the second objective lens 304) and/or by moving the object holder 114. By way of example, relative positioning of the electron beam in relation to the object 125 is implemented by readjusting (i.e., positioning) the electron beam (for example using the first condenser lens 105 and/or the second condenser lens 106 and/or the first objective lens 107 and/or the scanning device 115 of the SEM 100) and/or by moving the object holder 114.

Processing, imaging and/or analyzing of the object 125 arranged on the object holder 114 is implemented in a method step S9, for example using the ion beam and/or the electron beam. By way of example, material of the object 125 is ablated using the ion beam until the portion has a thickness of less than 100 nm, for example less than 80 nm, less than 60 nm, less than 40 nm or less than 20 nm. In particular, the thickness ranges between 1 nm and 10 nm. In one embodiment, a gas is fed to the object 125 using the gas feed device 1000 to this end, where the gas interacts with the ion beam and the object 125 in such a way that material is ablated from the object 125. This is discussed in greater detail further below.

In addition or as an alternative thereto, provision is made for the processing of the object 125 to include an arrangement of material on the object 125. By way of example, this is implemented with at least one gas being fed to the object 125 using the gas feed device 1000, where the gas interacts with the ion beam in such a way that material is arranged on the object 125.

Further additionally or in yet a further alternative, provision is made for the analysis of the object 125 arranged on the object holder 114 to include an analysis of the object 125 using EDX, WDX, EBSD, TKD examinations and/or examinations using the third detector 121 of the combination apparatus 200. To this end, the electron beam, for example, is guided to the object 125, in particular to the aforementioned portion of the object 125 with a thickness of less than 100 nm.

In addition or as an alternative thereto, provision is made for the object 125 arranged on the object holder 114 to be imaged using the ion beam and/or the electron beam. To this end, the ion beam and/or electron beam is guided to the object 125—in particular to the aforementioned portion of the object 125 with a thickness of less than 100 nm—and scanned over the object 125. An interaction of the ion beam and/or the electron beam with the object 125 arises. The interaction particles arising during the interaction, in particular secondary electrons, are detected, for example using the chamber detector 119. The detection signals are transmitted to the control unit 123 in order to generate an image of the object 125.

Figures 13, 14, 15:
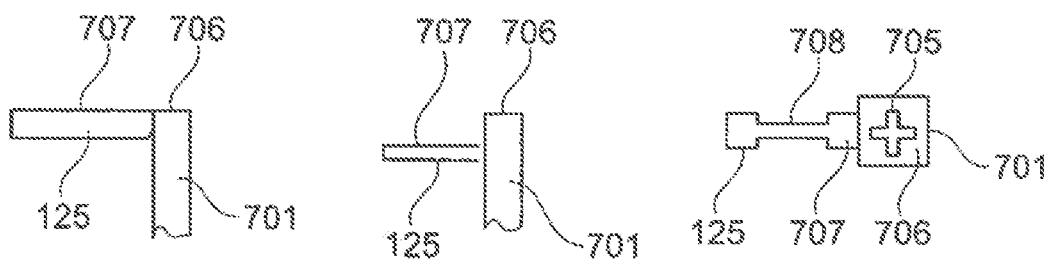
FIG. 13 shows a schematic illustration of a side view of a holding device of the object holder according to FIG. 12 after generating a face on the object holder.
FIG. 14 shows a further schematic illustration of a side view of a holding device of the object holder according to FIG. 12 after generating a face on the object holder.
FIG. 15 shows a schematic illustration of a plan view of a holding device of an object holder according to the system described herein.

In one embodiment of the method according to the system described herein, the method steps S5 to S9 are repeated after the method step S9. This is of particular advantage if the thickness of the object 125 or of at least a portion of the object 125 should be reduced. This is illustrated in FIG. 15. FIG. 15 shows a plan view of the first holding device 701, which has a face 706 with the marking 705. Arranged on the first holding device 701 is the object 125, which has a portion 708 of the object 125 whose thickness is reduced by material ablation. In order to attain this in one embodiment of the method according to the system described herein, the object holder 114 and the object 125 arranged on the object holder 114 are rotated through 0.5° to 5°, in particular through 1° to 3° or through 1° to 2°, in a first direction about the first stage axis of rotation 603 and/or the second stage axis of rotation 607 from an initial position during a first run-through of the method step S5. The aforementioned range boundaries of the angular ranges are included in the angular ranges. Explicit reference is made to the fact that the invention is not restricted to the aforementioned angular ranges. Rather, any suitable angular range can be used. This is followed by the method steps S6 to S9, with material being ablated from a first side of the portion 708 in the method step S9. The object holder 114 and the object 125 arranged on the object holder 114 are rotated through 0.5° to 5°, in particular through 1° to 3° or through 1° to 2°, in a second direction about the first stage axis of rotation 603 and/or the second stage axis of rotation 607 from the initial position during a second run-through of the method step S5. The second direction is counter to the first direction. The aforementioned range boundaries of the angular ranges are included in the angular ranges. Explicit reference is made to the fact that the invention is not restricted to the aforementioned angular ranges. Rather, any suitable angular range can be used. This is followed by the method steps S6 to S9, with material being ablated from a second side of the portion 708 in the method step S9. The second side is arranged opposite the first side. Moreover, the first side and the second side are arranged at a distance from one another.

Figure 11:
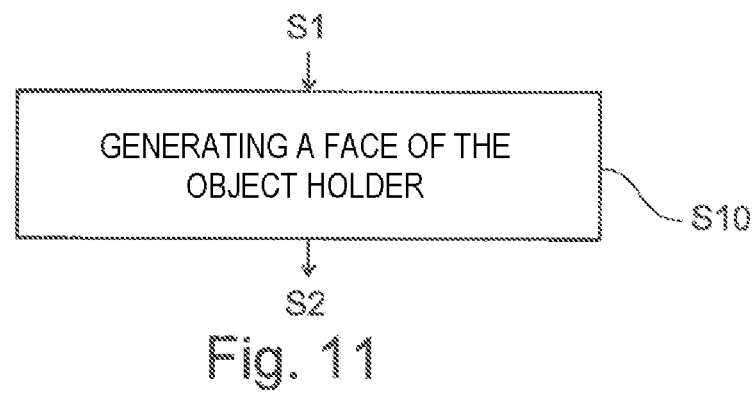
FIG. 11 shows a schematic illustration of a procedure of a further embodiment of a method for operating a particle beam apparatus according to the system described herein.
Figure 12:
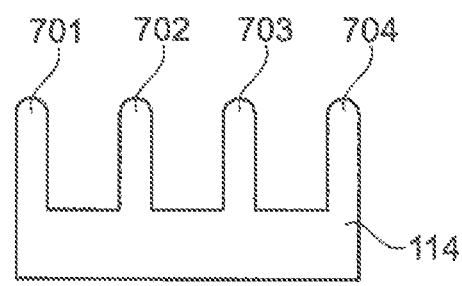
FIG. 12 shows a schematic illustration of a side view of a further object holder according to the system described herein.

FIG. 11 shows a further embodiment of the method according to the system described herein. The further embodiment of the method according to the system described herein as per FIG. 11 is based on the embodiment of the method according to the system described herein as per FIG. 8. Therefore, reference is initially made to the explanations provided above, which also apply in FIG. 11. In contrast to the embodiment of the method according to the system described herein as per FIG. 8, the further embodiment of the method according to the system described herein as per FIG. 11 includes a further method step S10, which is carried out between the method step S1 and the method step S2, for example. As an alternative thereto, the method step S10 can be carried out at any time before the method step S3. Initially, a face on which the marking 705 is arranged in the method step S3 is generated on the object holder 114 in the method step S10. If the object holder 114 does not have a face or only has a face that is unsuitable for the arrangement of the marking 705 (for example, with an unsuitable elevation, with an unsuitable alignment, with a curved or very strongly inclined face), then this embodiment of the method according to the system described herein provides for the face to be initially generated on the object holder 114. FIG. 12 shows an embodiment of the object holder 114 with a first holding device 701, with a second holding device 702, with a third holding device 703 and with a fourth holding device 704. The ends of the aforementioned holding devices 701-704 are rounded. By way of example, the object 125 is arranged on the first holding device 701. A face on which the marking 705 is arranged in turn is arranged in the rounded region of the first holding device 701. By way of example, the face on the first holding device 701 of the object holder 114 is then generated using the ion beam by, for example, ablating material from the first holding device 701 of the object holder 114 using the ion beam. For ablation purposes, a gas can be fed to the first holding device 701 in particular using the gas feed device 1000. Material of the first holding device 701 is ablated on account of the interaction of the ion beam with the gas and with the material of the first holding device 701. In addition or as an alternative thereto, provision is made for the face to be generated by applying material to the first holding device 701 using the ion beam while a gas is fed from the gas feed device 1000. FIG. 13 shows a schematic illustration of the first holding device 701 with the face generated on the holding device 701, where the face is provided with a reference sign 706.

In a further embodiment of the method according to the system described herein as per FIG. 8, the object 125 is arranged on the object holder 114 in such a way in the method step S2 that a face of the object 125 is arranged at an angle of 0° to 360°, for example 5° to 80°, with respect to a face of the object holder 114 that is freely accessible to the ion beam and/or the electron beam. By way of example, the face of the object 125 is arranged parallel to a face of the object holder 114 that is freely accessible to the ion beam and/or electron beam. This is illustrated in exemplary fashion in FIG. 13. The object 125 is arranged on the first holding device 701 of the object holder 114 in such a way that the face 706 on the first holding device 701 is aligned parallel to a face 707 of the object 125. In the embodiment illustrated in FIG. 13, the face 707 of the object 125 and the face 706 of the first holding device 701 are arranged in a single plane. Expressed differently, the face 707 of the object 125 and the face 706 of the first holding device 701 are level. The marking 705 is generated and arranged on the face 706 of the first holding device 701. This embodiment of the method according to the system described herein ensures particularly good positioning of the ion beam and/or of the electron beam relative to the object 125 since the marking 705 and the object 125 are arranged in a single plane. In addition or as an alternative thereto, provision is made for the face 707 of the object 125 and the face 706 of the first holding device 701 to be arranged in different planes. This is illustrated in FIG. 14. FIG. 14 is based on FIG. 13. Identical component parts are provided with identical reference signs.

According to yet a further embodiment of the method according to the system described herein as per FIG. 8, provision is made for the ion beam, used for example to generate the marking 705 on the object holder 114 in the method step S3, to have a specifiable beam current. By way of example, the beam current of the ion beam ranges between 10 pA and 500 pA. The range boundaries are included in the range. Explicit reference is made to the fact that the invention is not restricted to the aforementioned range. Instead, any suitable range can be used. In this embodiment of the method according to the system described herein, provision is made for (i) the reference image that includes the marking 705 to be generated, (ii) the further image that includes the marking 705 to be generated and (iii) processing, imaging and/or analyzing the object 125 to be implemented using the ion beam with the specifiable beam current. Accordingly, in this embodiment of the method according to the system described herein, provision is made for the ion beam to always be operated with the same beam current (specifically, the specifiable beam current), to be precise when generating the reference image that includes the marking 705, when generating the further image that includes the marking 705, when processing, when imaging and/or when analyzing the object 125.

In yet a further embodiment of the method according to the system described herein as per FIG. 8, provision is made for the ion beam to have a specifiable first beam current or a specifiable second beam current. The generation of the reference image that includes the marking 705 is implemented using the ion beam with the specifiable first beam current. By way of example, the first beam current of the ion beam ranges between 1 nA and 10 nA. The range boundaries are included in the range. Explicit reference is made to the fact that the invention is not restricted to the aforementioned range. Instead, any range that is suitable can be used. The second beam current of the ion beam ranges between 10 pA and 500 pA, for example. By way of example, the further image that includes the marking 705 is generated using the ion beam with the first beam current or with the second beam current. Moreover, processing, imaging and/or analyzing the object 125 are/is implemented using the ion beam with the second beam current.

The system described herein is also advantageous in that, in particular following a movement of the object holder 114 but also after any other relative movement of the object holder 114 in relation to the particle beam (and/or the laser beam, if the latter is used), relative positioning of the particle beam and/or of the laser beam is easily facilitated in relation to the object 125 arranged on the object holder 114. In particular, the relative positioning of the particle beam and/or of the laser beam in relation to the object 125 can be carried out automatically.

None of the described embodiments of the method according to the invention is restricted to the aforementioned sequence of the explained method steps. Rather, any sequence of the aforementioned method steps suitable for the invention can be chosen. The features of the invention disclosed in the present description, in the drawings and in the claims may be essential for the realization of the invention in the various embodiments thereof, both individually and in arbitrary combinations. The invention is not restricted to the described embodiments and may be varied within the scope of the claims and taking into account the knowledge of the relevant person skilled in the art.

The invention claimed is:

1. A method for operating a beam apparatus comprising:
generating at least one marking on an object holder using a laser beam of a laser beam apparatus and/or a particle beam of a particle beam apparatus, wherein the particle beam includes charged particles;
arranging at least one object on the object holder;
moving the object holder using a translational movement of the object holder along at least one axis (x-axis, y-axis, z-axis) and/or a rotation of the object holder about at least one axis of rotation;
positioning the particle beam and/or the laser beam in relative fashion in relation to the object using the marking; and
processing, imaging and/or analyzing the object using the particle beam and/or the laser beam.

2. The method as claimed in claim 1, wherein an object holder suitable for feeding an examination particle beam with particles that transmit through the object is used as the object holder.

3. The method as claimed in claim 1, wherein the object is generated using the particle beam and/or the laser beam before the object is arranged on the object holder.

4. The method as claimed in claim 1, wherein
the object is arranged on the object holder in such a way that a face of the object is arranged at an angle of 0° to 360° with respect to a face of the object holder that is freely accessible to the particle beam and/or to the laser beam and wherein
the marking is generated on the face of the object holder.

5. The method as claimed in claim 4, wherein either
(i) the face of the object is arranged parallel to the face of the object holder that is freely accessible to the particle beam and/or to the laser beam; or
(ii) the face of the object is arranged at an angle of 5° to 80° with respect to the face of the object holder that is freely accessible to the particle beam and/or to the laser beam.

6. The method as claimed in claim 4, wherein the face of the object holder is generated using the particle beam and/or the laser beam before the marking is generated on the face of the object holder.

7. The method as claimed in claim 1, wherein positioning the particle beam and/or the laser beam in relative fashion includes:
generating a reference image that includes the marking by imaging the marking using the particle beam;
generating a further image that includes the marking by renewed imaging of the marking using the particle beam;
comparing the reference image that includes the marking to the further image that includes the marking;
determining a displacement vector using the comparison of the reference image that includes the marking with the further image that includes the marking, wherein the relative positioning of the particle beam and/or of the laser beam is implemented using the displacement vector.

8. The method as claimed in claim 7, wherein either
(i) the particle beam has a specifiable beam current, wherein both generating the further image that includes the marking and processing, imaging and/or analyzing the object are implemented using the particle beam with the specifiable beam current; or
(ii) the particle beam has a specifiable beam current, wherein generating the reference image that includes the marking, generating the further image that includes the marking and processing, imaging and/or analyzing the object are implemented using the particle beam with the specifiable beam current.

9. The method as claimed in claim 7, wherein either
(i) the particle beam has a specifiable first beam current or a specifiable second beam current, wherein generating the further image that includes the marking is implemented using the particle beam with the specifiable first beam current and wherein processing, imaging and/or analyzing the object are/is implemented using the particle beam with the specifiable second beam current; or
(ii) the particle beam has a specifiable first beam current or a specifiable second beam current, wherein generating the reference image that includes the marking is implemented using the particle beam with the specifiable first beam current, wherein generating the further image that includes the marking is implemented using the particle beam with the specifiable first beam current and wherein processing, imaging and/or analyzing the object are/is implemented using the particle beam with the specifiable second beam current.

10. The method as claimed in claim 1, wherein either
(i) the processing of the object includes an ablation of material from the object; and/or
(ii) the processing of the object includes an arrangement of material on the object; and/or
(iii) analyzing the object includes an analysis using EDX and/or using WDX and/or using EBSD and/or using TKD and/or using electron-beam imaging and/or using a transmission detector.

11. The method as claimed in claim 1, wherein either
(i) the charged particles are ions; or
(ii) the charged particles are electrons.

12. The method as claimed in claim 1, wherein either
(i) the particle beam is a first particle beam, wherein the object is imaged using a second particle beam; or
(ii) the particle beam is a first particle beam, wherein the charged particles of the first particle beam include ions and wherein the object is imaged using a second particle beam, wherein the second particle beam includes electrons.

13. The method as claimed in claim 12, wherein positioning the particle beam and/or the laser beam in relative fashion includes:
generating a further reference image that includes the marking by imaging the marking using the second particle beam;
generating yet a further image that includes the marking by renewed imaging of the marking using the second particle beam;
comparing the further reference image that includes the marking to the yet further image that includes the marking; and
determining a further displacement vector using the comparison of the further reference image that includes the marking with the yet further image that includes the marking, wherein the relative positioning of the particle beam and/or of the laser beam is implemented using the further displacement vector.

14. The method as claimed in claim 1, wherein either
(i) the marking is generated as a marking with at least one edge, wherein a first plane extends in a first dimension and a second plane extends in a second dimension from the edge; and/or
(ii) the marking is generated as a marking with at least one first edge and with at least one second edge, wherein from both the first edge and from the second edge a first plane extends in a first dimension in each case and a second plane extends in a second dimension in each case, wherein two respective first planes differ from one another and wherein two respective second planes differ from one another; and/or
(iii) the marking is generated as a cross-shaped marking and/or as a polygon; and/or
(iv) the marking is generated as a star-shaped marking; and/or
(v) the marking is generated as an X-shaped marking; and/or
(vi) the marking is generated as an L-shaped marking; and/or
(vii) the marking is generated by ablating material and/or by applying material.

15. A computer program product comprising program code which can be loaded into a processor and which, when executed, controls a beam apparatus to perform the following steps:
generating at least one marking on an object holder using a laser beam of a laser beam apparatus and/or a particle beam of a particle beam apparatus, wherein the particle beam includes charged particles and wherein at least one object is arranged on the object holder;
moving the object holder using a translational movement of the object holder along at least one axis (x-axis, y-axis) and/or a rotation of the object holder about at least one axis of rotation;
positioning the particle beam and/or the laser beam in relative fashion in relation to the object using the marking; and
processing, imaging and/or analyzing the object using the particle beam and/or the laser beam.

16. A beam apparatus for processing, imaging and/or analyzing an object, comprising:
at least one beam generator that generates a particle beam with charged particles and/or a laser beam;
at least one object holder that arranges the object;
at least one scanning device that scans the particle beam and/or the laser beam over the object;
at least one detector that detects interaction particles and/or interaction radiation resulting from an interaction of the particle beam and/or the laser beam with the object;
at least one display device that displays the image and/or the analysis of the object, and
at least one control unit having a processor in which a computer program product is loaded, the computer program product performing the following steps:
generating at least one marking on an object holder using a laser beam of a laser beam apparatus and/or a particle beam of a particle beam apparatus, wherein the particle beam includes charged particles and wherein at least one object is arranged on the object holder;
moving the object holder using a translational movement of the object holder along at least one axis and/or a rotation of the object holder about at least one axis of rotation;
positioning the particle beam and/or the laser beam in relative fashion in relation to the object using the marking; and
processing, imaging and/or analyzing the object using the particle beam and/or the laser beam.

17. The beam apparatus as claimed in claim 16, wherein the beam apparatus is a particle beam apparatus and wherein the particle beam apparatus includes at least one objective lens for focusing the particle beam onto the object.

18. The beam apparatus as claimed in claim 17, wherein the beam generator as a first beam generator and the particle beam is a first particle beam with first charged particles and wherein the objective lens is a first objective lens that focuses the first particle beam onto the object, the particle beam apparatus further comprising:
   at least one second beam generator that generates a second particle beam with second charged particles; and
   at least one second objective lens that focuses the second particle beam onto the object.

19. The beam apparatus as claimed in claim 17, wherein the particle beam apparatus is an electron beam apparatus and/or an ion beam apparatus.

20. An object holder for arrangement in a particle beam apparatus, comprising:
   at least one holding device that holds an object; and,
   at least one marking that positions a particle beam of the particle beam apparatus, wherein
   the object holder feeds charged particles which transmit through the object.

21. The object holder as claimed in claim 20, wherein
   the object holder has a face which is configured in such a way that the face is freely accessible to a particle beam of a particle beam device,
   the marking is arranged on the face of the object holder and wherein
   the object holder is configured in such a way that a face of the object is able to be arranged at an angle of 0° to 360° with respect to the face of the object holder.

22. The object holder as claimed in claim 21, wherein the face of the object and the face of the object holder are able to be arranged in a plane.

23. The object holder as claimed in claim 20, wherein the marking is arranged on the holding device.

24. The object holder as claimed in claim 20, wherein either
   (i) the marking is formed as a marking with at least one edge, wherein a first plane extends in a first dimension and a second plane extends in a second dimension from the edge; and/or
   (ii) the marking is formed as a marking with at least one first edge and with at least one second edge, wherein from both the first edge and from the second edge a first plane extends in a first dimension in each case and a second plane extends in a second dimension in each case, wherein two respective first planes differ from one another and wherein two respective second planes differ from one another; and/or
   (iii) the marking is formed as a cross-shaped marking and/or as a polygon; and/or
   (iv) the marking is formed as a star-shaped marking; and/or
   (v) the marking is formed as an X-shaped marking; and/or
   (vi) the marking is formed as an L-shaped marking; and/or
   (vii) the marking is a marking generated by ablating material and/or by applying material.

* * * * *